United States Patent [19]
Ooi

[11] Patent Number: 5,398,027
[45] Date of Patent: Mar. 14, 1995

[54] DECODING CIRCUIT FOR VARIABLE LENGTH CODE

[75] Inventor: Yasushi Ooi, Tokyo, Japan

[73] Assignee: NEC Corporation, Tokyo, Japan

[21] Appl. No.: 101,357

[22] Filed: Aug. 3, 1993

[30] Foreign Application Priority Data

Aug. 3, 1992 [JP] Japan .................................. 4-206345

[51] Int. Cl.[6] ............................................. H03M 7/40
[52] U.S. Cl. ...................................... 341/67; 341/106; 341/65
[58] Field of Search .................... 341/65, 67, 106, 107

[56] References Cited

U.S. PATENT DOCUMENTS

| | | | |
|---|---|---|---|
| 3,921,143 | 11/1975 | Woodrum | 341/67 |
| 4,580,129 | 4/1986 | Bahgat | 341/67 |
| 4,899,149 | 2/1990 | Kahan | 341/67 |
| 5,126,738 | 6/1992 | Sasaki | 341/67 |
| 5,181,031 | 1/1993 | Tong et al. | 341/67 |
| 5,220,325 | 6/1993 | Ackland et al. | 341/67 |
| 5,254,991 | 10/1993 | Ruetz et al. | 341/67 |

*Primary Examiner*—Howard L. Williams
*Attorney, Agent, or Firm*—Foley & Lardner

[57] ABSTRACT

A variable length code decoding circuit includes a decoding table storing data, which has an upper field selectively indicative of a meaning of the code and an address for next access, selected depending upon a state transition upon decoding the variable bit length code per n bits (n is an integer greater than or equal to 2), an intermediate field indicative of a shifting magnitude of the shift register upon completion of decoding, and a lower field indicative of a state of code decoding. The bit sequence of the variable bit length code in a shift register is shifted in a magnitude corresponding to a shifting magnitude indicated in the intermediate field when data indicative of the code decoding state in the lower field of the data read out from the decoding table storage means indicates completion of decoding and corresponding to n bits when the data indicative of the code decoding state in the lower field indicates continuation of decoding. An address for accessing the decoding table is generated by replacing the intermediate field and the lower field with leading n bits of the shift register.

13 Claims, 21 Drawing Sheets

FIG. 2

| ADDRESS | ENTRY ADDRESS MEANING OF CODE | SHIFTING MAGNITUDE | DECODING STATE |
|---|---|---|---|
| 0100000 | 0101000 | 00 | 1 |
| | 0110000 | 00 | 1 |
| | 0000011 | 11 | 0 |
| | 0000100 | 11 | 0 |
| | 0000001 | 10 | 0 |
| | 0000001 | 10 | 0 |
| | 0000010 | 10 | 0 |
| | 0000010 | 10 | 0 |
| 0101000 | 0111000 | 00 | 1 |
| | 1000000 | 00 | 1 |
| | 0001000 | 10 | 0 |
| | 0001000 | 10 | 0 |
| | 0000111 | 01 | 0 |
| | 0000111 | 01 | 0 |
| | 0000111 | 01 | 0 |
| | 0000111 | 01 | 0 |
| 0110000 | 0000101 | 01 | 0 |
| | 0000101 | 01 | 0 |
| | 0000101 | 01 | 0 |
| | 0000101 | 01 | 0 |
| | 0000110 | 01 | 0 |
| | 0000110 | 01 | 0 |
| | 0000110 | 01 | 0 |
| | 0000110 | 01 | 0 |

| ADDRESS | | | |
|---|---|---|---|
| 0111000 | 0001101 | 10 | 0 |
| | 0001101 | 10 | 0 |
| | 0001100 | 10 | 0 |
| | 0001100 | 10 | 0 |
| | 0001011 | 01 | 0 |
| | 0001011 | 01 | 0 |
| | 0001011 | 01 | 0 |
| | 0001011 | 01 | 0 |
| 1000000 | 0001001 | 01 | 0 |
| | 0001001 | 01 | 0 |
| | 0001001 | 01 | 0 |
| | 0001001 | 01 | 0 |
| | 0001000 | 01 | 0 |
| | 0001000 | 01 | 0 |
| | 0001000 | 01 | 0 |
| | 0001000 | 01 | 0 |

FIG. 4

| ADDRESS | NEXT TABLE ENTRY ADDRESS | | DECODING STATE |
|---|---|---|---|
| | MEANING OF CODE | SHIFTING MAGNITUDE | |
| 0100000 | 01010 | 00 | 11 |
| | 01100 | 00 | 01 |
| | 00011 | 11 | 00 |
| | 00100 | 11 | 00 |
| | 00001 | 10 | 00 |
| | 00001 | 10 | 00 |
| | 00010 | 10 | 00 |
| | 00010 | 10 | 00 |
| 0101000 | 01101 | 00 | 10 |
| | 01100 | 10 | 01 |
| | 01000 | 10 | 00 |
| | 01000 | 10 | 00 |
| | 00111 | 01 | 00 |
| | 00111 | 01 | 00 |
| | 00111 | 01 | 00 |
| | 00111 | 01 | 00 |
| 0110000 | 00101 | 01 | 00 |
| | 00110 | 01 | 00 |
| 0110010 | 01001 | 01 | 00 |
| | 01010 | 01 | 00 |
| 0110100 | 01101 | 10 | 00 |
| | 01100 | 10 | 00 |
| | 01011 | 01 | 00 |
| | 01011 | 01 | 00 |

FIG. 9

| ENTRY_NUM | DATA/ADDR | NEXT_SFT | TERM/NONTERM |
|---|---|---|---|
| 0 | 16 | 4 | 1 |
| 1 | 32 | 4 | 1 |
| 2 | 48 | 4 | 1 |
| 3 | 64 | 4 | 1 |
| 4 | 0002 | 4 | 0 |
| 5 | 0201 | 4 | 0 |
| 6 | 0101 | 3 | 0 |
| 7 | 0101 | 3 | 0 |
| 8 | ffff | 2 | 0 |
| 9 | ffff | 2 | 0 |
| 10 | ffff | 2 | 0 |
| 11 | ffff | 2 | 0 |
| 12 | 0001 | 2 | 0 |
| 13 | 0001 | 2 | 0 |
| 14 | 0001 | 2 | 0 |
| 15 | 0001 | 2 | 0 |
| 16 | 80 | 4 | 1 |
| 17 | 96 | 4 | 1 |
| 18 | 112 | 4 | 1 |
| 19 | 128 | 4 | 1 |
| 20 | fffe | 2 | 0 |
| 21 | fffe | 2 | 0 |
| 22 | fffe | 2 | 0 |
| 23 | fffe | 2 | 0 |
| 24 | 0202 | 3 | 0 |
| 25 | 0202 | 3 | 0 |
| 26 | 0901 | 3 | 0 |
| 27 | 0901 | 3 | 0 |
| 28 | 0004 | 3 | 0 |
| 29 | 0004 | 3 | 0 |
| 30 | 0801 | 3 | 0 |
| 31 | 0801 | 3 | 0 |
| 32 | 0701 | 2 | 0 |
| 33 | 0701 | 2 | 0 |
| 34 | 0701 | 2 | 0 |
| 35 | 0701 | 2 | 0 |
| 36 | 0601 | 2 | 0 |
| 37 | 0601 | 2 | 0 |
| 38 | 0601 | 2 | 0 |
| 39 | 0601 | 2 | 0 |
| 40 | 0102 | 2 | 0 |
| 41 | 0102 | 2 | 0 |
| 42 | 0102 | 2 | 0 |
| 43 | 0102 | 2 | 0 |
| 44 | 0501 | 2 | 0 |
| 45 | 0501 | 2 | 0 |
| 46 | 0501 | 2 | 0 |
| 47 | 0501 | 2 | 0 |
| 48 | 0d01 | 4 | 0 |
| 49 | 0006 | 4 | 0 |
| 50 | 0c01 | 4 | 0 |
| 51 | 0b01 | 4 | 0 |
| 52 | 0302 | 4 | 0 |
| 53 | 0103 | 4 | 0 |
| 54 | 0003 | 4 | 0 |
| 55 | 0a01 | 4 | 0 |
| 56 | 0003 | 1 | 0 |
| 57 | 0003 | 1 | 0 |
| 58 | 0003 | 1 | 0 |
| 59 | 0003 | 1 | 0 |
| 60 | 0003 | 1 | 0 |
| 61 | 0003 | 1 | 0 |
| 62 | 0003 | 1 | 0 |
| 63 | 0003 | 1 | 0 |
| 64 | 0401 | 1 | 0 |
| 65 | 0401 | 1 | 0 |
| 66 | 0401 | 1 | 0 |
| 67 | 0401 | 1 | 0 |
| 68 | 0401 | 1 | 0 |
| 69 | 0401 | 1 | 0 |
| 70 | 0401 | 1 | 0 |
| 71 | 0401 | 1 | 0 |
| 72 | 0301 | 1 | 0 |
| 73 | 0301 | 1 | 0 |
| 74 | 0301 | 1 | 0 |
| 75 | 0301 | 1 | 0 |
| 76 | 0301 | 1 | 0 |
| 77 | 0301 | 1 | 0 |
| 78 | 0301 | 1 | 0 |
| 79 | 0301 | 1 | 0 |
| 80 | fffd | 4 | 0 |
| 81 | 144 | 2 | 1 |
| 82 | 148 | 2 | 1 |
| 83 | 152 | 2 | 1 |
| 84 | 156 | 2 | 1 |
| 85 | 160 | 2 | 1 |
| 86 | 164 | 2 | 1 |
| 87 | 168 | 2 | 1 |
| 88 | 172 | 2 | 1 |
| 89 | 176 | 2 | 1 |
| 90 | 180 | 2 | 1 |
| 91 | 184 | 2 | 1 |
| 92 | 188 | 2 | 1 |
| 93 | 192 | 2 | 1 |
| 94 | 196 | 2 | 1 |
| 95 | 200 | 2 | 1 |
| 96 | 000b | 4 | 0 |
| 97 | 0802 | 4 | 0 |
| 98 | 0403 | 4 | 0 |
| 99 | 000a | 4 | 0 |
| 100 | 0204 | 4 | 0 |
| 101 | 0702 | 4 | 0 |
| 102 | 1501 | 4 | 0 |
| 103 | 1401 | 4 | 0 |
| 104 | 0009 | 4 | 0 |
| 105 | 1301 | 4 | 0 |
| 106 | 1201 | 4 | 0 |
| 107 | 0105 | 4 | 0 |
| 108 | 0303 | 4 | 0 |
| 109 | 0008 | 4 | 0 |
| 110 | 0602 | 4 | 0 |
| 111 | 1101 | 2 | 0 |
| 112 | 1001 | 2 | 0 |
| 113 | 1001 | 2 | 0 |
| 114 | 1001 | 2 | 0 |
| 115 | 1001 | 2 | 0 |
| 116 | 0502 | 2 | 0 |
| 117 | 0502 | 2 | 0 |
| 118 | 0502 | 2 | 0 |
| 119 | 0502 | 2 | 0 |
| 120 | 0007 | 2 | 0 |
| 121 | 0007 | 2 | 0 |
| 122 | 0007 | 2 | 0 |
| 123 | 0007 | 2 | 0 |
| 124 | 0203 | 2 | 0 |
| 125 | 0203 | 2 | 0 |
| 126 | 0203 | 2 | 0 |
| 127 | 0203 | 2 | 0 |
| 128 | 0104 | 2 | 0 |
| 129 | 0104 | 2 | 0 |
| 130 | 0104 | 2 | 0 |
| 131 | 0104 | 2 | 0 |
| 132 | 0f01 | 2 | 0 |
| 133 | 0f01 | 2 | 0 |
| 134 | 0f01 | 2 | 0 |
| 135 | 0f01 | 2 | 0 |
| 136 | 0e01 | 2 | 0 |
| 137 | 0e01 | 2 | 0 |
| 138 | 0e01 | 2 | 0 |
| 139 | 0e01 | 2 | 0 |
| 140 | 0402 | 2 | 0 |
| 141 | 0402 | 2 | 0 |
| 142 | 0402 | 2 | 0 |
| 143 | 0402 | 2 | 0 |
| 144 | 204 | 2 | 1 |
| 145 | 208 | 2 | 1 |
| 146 | 212 | 2 | 1 |
| 147 | 216 | 2 | 1 |
| 148 | 220 | 2 | 1 |

FIG.10

| | | | |
|---|---|---|---|
| 149 | 224 | 2 | 1 |
| 150 | 228 | 2 | 1 |
| 151 | 232 | 2 | 1 |
| 152 | 236 | 2 | 1 |
| 153 | 240 | 2 | 1 |
| 154 | 244 | 2 | 1 |
| 155 | 248 | 2 | 1 |
| 156 | 001f | 2 | 0 |
| 157 | 001e | 2 | 0 |
| 158 | 001d | 2 | 0 |
| 159 | 001c | 2 | 0 |
| 160 | 001b | 2 | 0 |
| 161 | 001a | 2 | 0 |
| 162 | 0019 | 2 | 0 |
| 163 | 0018 | 2 | 0 |
| 164 | 0017 | 2 | 0 |
| 165 | 0016 | 2 | 0 |
| 166 | 0015 | 2 | 0 |
| 167 | 0014 | 2 | 0 |
| 168 | 0013 | 2 | 0 |
| 169 | 0012 | 2 | 0 |
| 170 | 0011 | 2 | 0 |
| 171 | 0010 | 2 | 0 |
| 172 | 0a02 | 1 | 0 |
| 173 | 0a02 | 1 | 0 |
| 174 | 0902 | 1 | 0 |
| 175 | 0902 | 1 | 0 |
| 176 | 0503 | 1 | 0 |
| 177 | 0503 | 1 | 0 |
| 178 | 0304 | 1 | 0 |
| 179 | 0304 | 1 | 0 |
| 180 | 0205 | 1 | 0 |
| 181 | 0205 | 1 | 0 |
| 182 | 0107 | 1 | 0 |
| 183 | 0107 | 1 | 0 |
| 184 | 0106 | 1 | 0 |
| 185 | 0106 | 1 | 0 |
| 186 | 000f | 1 | 0 |
| 187 | 000f | 1 | 0 |
| 188 | 000e | 1 | 0 |
| 189 | 000e | 1 | 0 |
| 190 | 000d | 1 | 0 |
| 191 | 000d | 1 | 0 |
| 192 | 000c | 1 | 0 |
| 193 | 000c | 1 | 0 |
| 194 | 1a01 | 1 | 0 |
| 195 | 1a01 | 1 | 0 |
| 196 | 1901 | 1 | 0 |
| 197 | 1901 | 1 | 0 |
| 198 | 1801 | 1 | 0 |
| 199 | 1801 | 1 | 0 |
| 200 | 1701 | 1 | 0 |
| 201 | 1701 | 1 | 0 |
| 202 | 1601 | 1 | 0 |
| 203 | 1601 | 1 | 0 |
| 204 | 0112 | 2 | 0 |
| 205 | 0111 | 2 | 0 |
| 206 | 0110 | 2 | 0 |
| 207 | 010f | 2 | 0 |
| 208 | 0603 | 2 | 0 |
| 209 | 1002 | 2 | 0 |
| 210 | 0f02 | 2 | 0 |
| 211 | 0e02 | 2 | 0 |
| 212 | 0d02 | 2 | 0 |
| 213 | 0c02 | 2 | 0 |
| 214 | 0b02 | 2 | 0 |
| 215 | 1f01 | 2 | 0 |
| 216 | 1e01 | 2 | 0 |
| 217 | 1d01 | 2 | 0 |
| 218 | 1c01 | 2 | 0 |
| 219 | 1b01 | 2 | 0 |
| 220 | 0028 | 1 | 0 |
| 221 | 0028 | 1 | 0 |
| 222 | 0027 | 1 | 0 |
| 223 | 0027 | 1 | 0 |
| 224 | 0026 | 1 | 0 |
| 225 | 0026 | 1 | 0 |
| 226 | 0025 | 1 | 0 |
| 227 | 0025 | 1 | 0 |
| 228 | 0024 | 1 | 0 |
| 229 | 0024 | 1 | 0 |
| 230 | 0023 | 1 | 0 |
| 231 | 0023 | 1 | 0 |
| 232 | 0022 | 1 | 0 |
| 233 | 0022 | 1 | 0 |
| 234 | 0021 | 1 | 0 |
| 235 | 0021 | 1 | 0 |
| 236 | 0020 | 1 | 0 |
| 237 | 0020 | 1 | 0 |
| 238 | 010e | 1 | 0 |
| 239 | 010e | 1 | 0 |
| 240 | 010d | 1 | 0 |
| 241 | 010d | 1 | 0 |
| 242 | 010c | 1 | 0 |
| 243 | 010c | 1 | 0 |
| 244 | 010b | 1 | 0 |
| 245 | 010b | 1 | 0 |
| 246 | 010a | 1 | 0 |
| 247 | 010a | 1 | 0 |
| 248 | 0109 | 1 | 0 |
| 249 | 0109 | 1 | 0 |
| 250 | 0108 | 1 | 0 |
| 251 | 0108 | 1 | 0 |

FIG. 12

| ENTRY_NUM | DATA/ADDR | NEXT_SFT | TERM/NONTERM |
|---|---|---|---|
| 0 | 132 | 1 | 1 |
| 1 | 128 | 2 | 1 |
| 2 | 112 | 3 | 1 |
| 3 | 108 | 4 | 1 |
| 4 | 104 | 5 | 1 |
| 5 | fffe | 6 | 0 |
| 6 | 96 | 7 | 1 |
| 7 | 80 | 8 | 1 |
| 8 | 64 | 9 | 1 |
| 9 | 48 | 10 | 1 |
| 10 | 32 | 11 | 1 |
| 11 | 16 | 12 | 1 |
| 12 | fffd | 13 | 0 |
| 13 | fffd | 14 | 0 |
| 14 | fffd | 15 | 0 |
| 15 | fffd | 16 | 0 |
| 16 | 0112 | 4 | 0 |
| 17 | 0111 | 4 | 0 |
| 18 | 0110 | 4 | 0 |
| 19 | 010f | 4 | 0 |
| 20 | 0603 | 4 | 0 |
| 21 | 1002 | 4 | 0 |
| 22 | 0f02 | 4 | 0 |
| 23 | 0e02 | 4 | 0 |
| 24 | 0d02 | 4 | 0 |
| 25 | 0c02 | 4 | 0 |
| 26 | 0b02 | 4 | 0 |
| 27 | 1f01 | 4 | 0 |
| 28 | 1e01 | 4 | 0 |
| 29 | 1d01 | 4 | 0 |
| 30 | 1c01 | 4 | 0 |
| 31 | 1b01 | 4 | 0 |
| 32 | 0028 | 4 | 0 |
| 33 | 0027 | 4 | 0 |
| 34 | 0026 | 4 | 0 |
| 35 | 0025 | 4 | 0 |
| 36 | 0024 | 4 | 0 |
| 37 | 0023 | 4 | 0 |
| 38 | 0022 | 4 | 0 |
| 39 | 0021 | 4 | 0 |
| 40 | 0020 | 4 | 0 |
| 41 | 010e | 4 | 0 |
| 42 | 010d | 4 | 0 |
| 43 | 010c | 4 | 0 |
| 44 | 010b | 4 | 0 |
| 45 | 010a | 4 | 0 |
| 46 | 0109 | 4 | 0 |
| 47 | 0108 | 4 | 0 |
| 48 | 001f | 4 | 0 |
| 49 | 001e | 4 | 0 |
| 50 | 001d | 4 | 0 |
| 51 | 001c | 4 | 0 |
| 52 | 001b | 4 | 0 |
| 53 | 001a | 4 | 0 |
| 54 | 0019 | 4 | 0 |
| 55 | 0018 | 4 | 0 |
| 56 | 0017 | 4 | 0 |
| 57 | 0016 | 4 | 0 |
| 58 | 0015 | 4 | 0 |
| 59 | 0014 | 4 | 0 |
| 60 | 0013 | 4 | 0 |
| 61 | 0012 | 4 | 0 |
| 62 | 0011 | 4 | 0 |
| 63 | 0010 | 4 | 0 |
| 64 | 0a02 | 4 | 0 |
| 65 | 0902 | 4 | 0 |
| 66 | 0503 | 4 | 0 |
| 67 | 0304 | 4 | 0 |
| 68 | 0205 | 4 | 0 |
| 69 | 0107 | 4 | 0 |
| 70 | 0106 | 4 | 0 |
| 71 | 000f | 4 | 0 |
| 72 | 000e | 4 | 0 |
| 73 | 000d | 4 | 0 |
| 74 | 000e | 4 | 0 |
| 75 | 1a01 | 4 | 0 |
| 76 | 1901 | 4 | 0 |
| 77 | 1801 | 4 | 0 |
| 78 | 1701 | 4 | 0 |
| 79 | 1601 | 4 | 0 |
| 80 | 000b | 4 | 0 |
| 81 | 0802 | 4 | 0 |
| 82 | 0403 | 4 | 0 |
| 83 | 000a | 4 | 0 |
| 84 | 0204 | 4 | 0 |
| 85 | 0702 | 4 | 0 |
| 86 | 1501 | 4 | 0 |
| 87 | 1401 | 4 | 0 |
| 88 | 0009 | 4 | 0 |
| 89 | 1301 | 4 | 0 |
| 90 | 1201 | 4 | 0 |
| 91 | 0105 | 4 | 0 |
| 92 | 0303 | 4 | 0 |
| 93 | 0008 | 4 | 0 |
| 94 | 0602 | 4 | 0 |
| 95 | 1101 | 4 | 0 |
| 96 | 1001 | 4 | 0 |
| 97 | 0502 | 3 | 0 |
| 98 | 0007 | 3 | 0 |
| 99 | 0203 | 3 | 0 |
| 100 | 0104 | 3 | 0 |
| 101 | 0f01 | 3 | 0 |
| 102 | 0e01 | 3 | 0 |
| 103 | 0402 | 3 | 0 |
| 104 | 0202 | 3 | 0 |
| 105 | 0901 | 2 | 0 |
| 106 | 0004 | 2 | 0 |
| 107 | 0801 | 2 | 0 |
| 108 | 0701 | 2 | 0 |
| 109 | 0601 | 2 | 0 |
| 110 | 0102 | 2 | 0 |
| 111 | 0501 | 2 | 0 |
| 112 | 136 | 2 | 1 |
| 113 | 140 | 2 | 1 |
| 114 | 144 | 2 | 1 |
| 115 | 148 | 2 | 1 |
| 116 | 0003 | 2 | 0 |
| 117 | 0003 | 2 | 0 |
| 118 | 0003 | 2 | 0 |
| 119 | 0003 | 2 | 0 |
| 120 | 0401 | 2 | 0 |
| 121 | 0401 | 2 | 0 |
| 122 | 0401 | 2 | 0 |
| 123 | 0401 | 2 | 0 |
| 124 | 0301 | 2 | 0 |
| 125 | 0301 | 2 | 0 |
| 126 | 0301 | 2 | 0 |
| 127 | 0301 | 2 | 0 |
| 128 | 0002 | 2 | 0 |
| 129 | 0201 | 2 | 0 |
| 130 | 0101 | 1 | 0 |
| 131 | 0101 | 1 | 0 |
| 132 | ffff | 1 | 1 |
| 133 | ffff | 1 | 1 |
| 134 | 0001 | 1 | 0 |
| 135 | 0001 | 1 | 0 |
| 136 | 0d01 | 1 | 0 |
| 137 | 0d01 | 1 | 0 |
| 138 | 0006 | 1 | 0 |
| 139 | 0006 | 1 | 0 |
| 140 | 0c01 | 1 | 0 |
| 141 | 0c01 | 1 | 0 |
| 142 | 0b01 | 1 | 0 |
| 143 | 0b01 | 1 | 0 |
| 144 | 0302 | 1 | 0 |
| 145 | 0302 | 1 | 0 |
| 146 | 0103 | 1 | 0 |
| 147 | 0103 | 1 | 0 |
| 148 | 0005 | 1 | 0 |
| 149 | 0005 | 1 | 0 |
| 150 | 0a01 | 1 | 0 |
| 151 | 0a01 | 1 | 0 |

| CODE | MEANING |
|---|---|
| 10 | 1 |
| 11 | 2 |
| 010 | 3 |
| 011 | 4 |
| 0010 | 5 |
| 0011 | 6 |
| 0001 | 7 |
| 00001 | 8 |
| 0000010 | 9 |
| 0000011 | 10 |
| 0000001 | 11 |
| 00000001 | 12 |
| 00000000 | 13 |

FIG.15
(PRIOR ART)

| | CODE | MEANING | DECODING STATE |
|---|---|---|---|
| START ADDRESS → | 100000 | 100010 | 1 |
| | | 100100 | 1 |
| | 100010 | 100110 | 1 |
| | | 101000 | 1 |
| | 100100 | 000001 | 0 |
| | | 000010 | 0 |
| | 100110 | 101010 | 1 |
| | | 101100 | 1 |
| | 101000 | 000011 | 0 |
| | | 000100 | 0 |
| | 101010 | 101110 | 1 |
| | | 000111 | 0 |
| | 101100 | 000101 | 0 |
| | | 000110 | 0 |
| | 101110 | 110000 | 1 |
| | | 001000 | 0 |
| | 110000 | 110010 | 1 |
| | | 110100 | 1 |
| | 110010 | 110110 | 1 |
| | | 001011 | 0 |
| | 110100 | 001001 | 0 |
| | | 001010 | 0 |
| | 110110 | 001101 | 0 |
| | | 001100 | 0 |

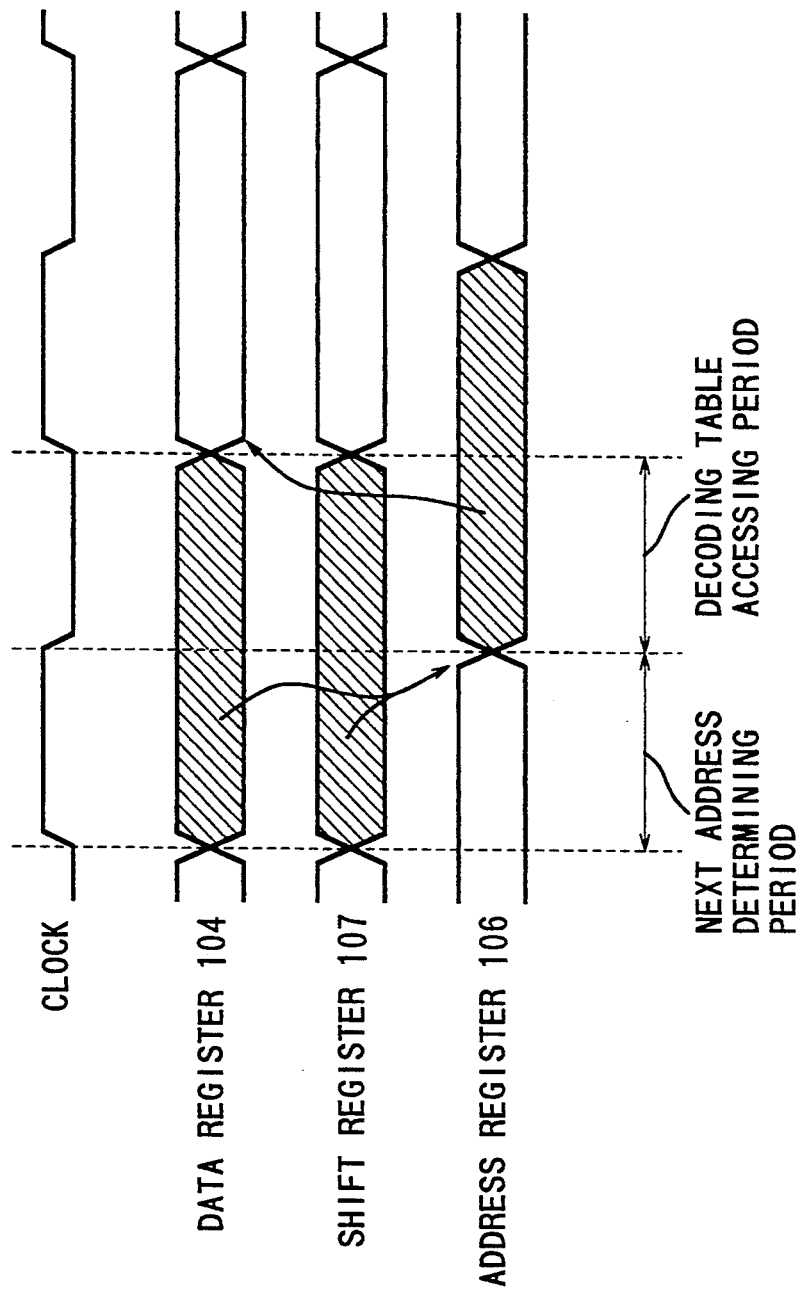

FIG.19
(PRIOR ART)

| ENTRY_NUM | DATA_FIELD | CODE |
|---|---|---|
| 1 | FFFF | 10.................... |
| 2 | 0001 | 11.................... |
| 3 | 0101 | 011................... |
| 4 | 0002 | 0100.................. |
| 5 | 0201 | 0101.................. |
| 6 | 0003 | 00101................. |
| 7 | 0301 | 00111................. |
| 8 | 0401 | 00110................. |
| 9 | 0102 | 000110................ |
| 10 | 0501 | 000111................ |
| 11 | 0601 | 000101................ |
| 12 | 0701 | 000100................ |
| 13 | 0004 | 0000110............... |
| 14 | 0202 | 0000100............... |
| 15 | 0801 | 0000111............... |
| 16 | 0901 | 0000101............... |
| 17 | FFFE | 000001................ |
| 18 | 0005 | 00100110.............. |
| 19 | 0006 | 00100001.............. |
| 20 | 0103 | 00100101.............. |
| 21 | 0302 | 00100100.............. |
| 22 | 0A01 | 00100111.............. |
| 23 | 0B01 | 00100011.............. |
| 24 | 0C01 | 00100010.............. |
| 25 | 0D01 | 00100000.............. |
| 26 | 0007 | 0000001010............ |
| 27 | 0104 | 0000001100............ |
| 28 | 0203 | 0000001011............ |
| 29 | 0402 | 0000001111............ |
| 30 | 0502 | 0000001001............ |
| 31 | 0E01 | 0000001110............ |
| 32 | 0F01 | 0000001101............ |
| 33 | 1001 | 0000001000............ |
| 34 | 0008 | 000000011101.......... |
| 35 | 0009 | 000000011000.......... |
| 36 | 000A | 000000010011.......... |
| 37 | 000B | 000000010000.......... |
| 38 | 0105 | 000000011011.......... |
| 39 | 0204 | 000000010100.......... |
| 40 | 0303 | 000000011100.......... |
| 41 | 0403 | 000000010010.......... |
| 42 | 0602 | 000000011110.......... |
| 43 | 0702 | 000000010101.......... |
| 44 | 0802 | 000000010001.......... |
| 45 | 1101 | 000000011111.......... |
| 46 | 1201 | 000000011010.......... |
| 47 | 1301 | 000000011001.......... |
| 48 | 1401 | 000000010111.......... |
| 49 | 1501 | 000000010110.......... |
| 50 | 000C | 0000000011010......... |
| 51 | 000D | 0000000011001......... |
| 52 | 000E | 0000000011000......... |
| 53 | 000F | 0000000010111......... |
| 54 | 0106 | 0000000010110......... |
| 55 | 0107 | 0000000010101......... |
| 56 | 0205 | 0000000010100......... |
| 57 | 0304 | 0000000010011......... |
| 58 | 0503 | 0000000010010......... |
| 59 | 0902 | 0000000010001......... |
| 60 | 0A02 | 0000000010000......... |
| 61 | 1601 | 0000000011111......... |
| 62 | 1701 | 0000000011110......... |
| 63 | 1801 | 0000000011101......... |
| 64 | 1901 | 0000000011100......... |
| 65 | 1A01 | 0000000011011......... |
| 66 | 0010 | 00000000011111....... |
| 67 | 0011 | 00000000011110....... |
| 68 | 0012 | 00000000011101....... |
| 69 | 0013 | 00000000011100....... |
| 70 | 0014 | 00000000011011....... |
| 71 | 0015 | 00000000011010....... |
| 72 | 0016 | 00000000011001....... |
| 73 | 0017 | 00000000011000....... |
| 74 | 0018 | 00000000010111....... |
| 75 | 0019 | 00000000010110....... |
| 76 | 001A | 00000000010101....... |
| 77 | 001B | 00000000010100....... |
| 78 | 001C | 00000000010011....... |
| 79 | 001D | 00000000010010....... |
| 80 | 001E | 00000000010001....... |
| 81 | 001F | 00000000010000....... |
| 82 | 0020 | 000000000011000...... |
| 83 | 0021 | 000000000010111...... |
| 84 | 0022 | 000000000010110...... |
| 85 | 0023 | 000000000010101...... |
| 86 | 0024 | 000000000010100...... |
| 87 | 0025 | 000000000010011...... |
| 88 | 0026 | 000000000010010...... |
| 89 | 0027 | 000000000010001...... |
| 90 | 0028 | 000000000010000...... |
| 91 | 0108 | 000000000011111...... |
| 92 | 0109 | 000000000011110...... |
| 93 | 010A | 000000000011101...... |
| 94 | 010B | 000000000011100...... |
| 95 | 010C | 000000000011011...... |
| 96 | 010D | 000000000011010...... |
| 97 | 010E | 000000000011001...... |
| 98 | 010F | 0000000000010011..... |
| 99 | 0110 | 0000000000010010..... |
| 100 | 0111 | 0000000000010001..... |
| 101 | 0112 | 0000000000010000..... |
| 102 | 0603 | 0000000000010100..... |
| 103 | 0B02 | 0000000000011010..... |
| 104 | 0C02 | 0000000000011001..... |
| 105 | 0D02 | 0000000000011000..... |
| 106 | 0E02 | 0000000000010111..... |
| 107 | 0F02 | 0000000000010110..... |
| 108 | 1102 | 0000000000010101..... |
| 109 | 1B01 | 0000000000011111..... |
| 110 | 1C01 | 0000000000011110..... |
| 111 | 1D01 | 0000000000011101..... |
| 112 | 1E01 | 0000000000011100..... |
| 113 | 1F01 | 0000000000011011..... |
| 114 | FFF0 | 000000000000......... |

FIG.21
(PRIOR ART)

| | | ADDRESS DATA | DECODING STATE |
|---|---|---|---|
| START ADDRESS → | 100000 | 100010 | 1 |
| | | 100100 | 1 |
| | 100010 | 100110 | 1 |
| | | 101000 | 1 |
| | 100100 | 000001 | 0 |
| | | 000010 | 0 |
| | 100110 | 101010 | 1 |
| | | 101100 | 1 |
| | 101000 | 000011 | 0 |
| | | 000100 | 0 |
| | 101010 | 101110 | 1 |
| | | 000111 | 0 |
| | 101100 | 000101 | 0 |
| | | 000110 | 0 |
| | 101110 | 110000 | 1 |
| | | 001000 | 0 |
| | 110000 | 110010 | 1 |
| | | 110100 | 1 |
| | 110010 | 110110 | 1 |
| | | 001011 | 0 |
| | 110100 | 001001 | 0 |
| | | 001010 | 0 |
| | 110110 | 001101 | 0 |
| | | 001100 | 0 |

DECODING CIRCUIT FOR VARIABLE LENGTH CODE

BACKGROUND OF THE INVENTION

1. Field of the Invention

The present invention relates generally to a decoding circuit for a code which is variable of length per bit. More specifically, the invention relates to a decoding circuit which can unitedly process a plurality of bits and can variably designate number of bits to be processed.

2. Description of the Related Art

It has been known that a compression coding can be realized by employing variable-length code with providing shorter codes for signals having high frequencies of occurrences and longer codes for signals having low frequencies of occurrences. Such a manner of encoding is called as entropy coding. It should be noted that Huffman coding is a kind of entropy coding. Such entropy coding has been employed in various applications, such as for encoding of a voice signal, a video signal and so forth. In case, a time-series signal encoded employing the entropy coding and thus having inclination of frequencies of occurrences of codes is to be decoded, there are generally two known types of decoding circuits, in the prior art. The first type is a decoding system, in which the variable length code is received per bit in serial manner and the decoding is performed with discrimination employing a binary tree. The second type is a decoding system, in which the variable length code is unitedly processed with decoding the code and the code length simultaneously. Hereinafter further discussed will be given for the first and second types of systems with reference to the accompanying drawings.

FIGS. 14(A) and 14(B) respectively illustrate a variable length code table and a state transition by the binary tree for detailed discussion of the conventional first type decoding circuit. As shown in FIG. 14(A), the shown variable length code table defines a variable length or non-equal length code having code lengths depending upon frequencies of occurrences. The left column shows definitions of the codes and the right column shows meaning (positive integer in the shown case) of the codes. On the other hand, as shown in FIG. 14(B), the state transition by the binary tree provides decoding procedure for performing decoding of the codes per each bit from the left side. Namely, the circles in FIG. 14(B) represent initial state and intermediate state in decoding procedure. Upon initiation of decoding, process is started from the leftmost circle. If the initial bit in decoding is "0", the process branches to a branch (arrow) of "0" and to a branch of "1" otherwise. By repeating such transition for each bit, decoding is completed when a figure is reached.

FIG. 15 shows a conventional variable length decoding table. The decoding table of FIG. 15 illustrates an example realizing the binary tree transition diagram shown in FIG. 14(B) in a form of a table. In the shown table, the right column shows a bit representing intermediate state and completed state of decoding. In the table, "0" represents the decoding completed state and "1" represents the decoding incomplete state. The left column includes addresses of next table entries in case of the decoding incomplete state and the decoded meaning (positive integers in the shown case) in case of the decoding completed state. Decoding process is started at a start address "100000". Then, reference is made to the address "100000" if the leading bit of the code is "0", and to the address "100001" if the leading bit of the code is "1". For example, in case of the address "100001", since the right column is "1" to represents the decoding incomplete state and the left column is "100100" representing that the next address to access is the address "100100". Therefore, from the content of in the address "100001" of the shown table, it can be judged that decoding has to be continued with accessing the address "100100". At the address "100100", since the right column is "0" to represent the decoding completed state and the left column has a content value "000001". Form this, the results of decoding as positive integer "1" can be obtained.

As can be appreciated from the example set forth above, in relation to the number of codes k (k=13 in the shown case), a sum of the decoding incomplete state and the initial state, namely number of cycles in FIG. 14 becomes k−1. This principle may be easily understood by imaging a tournament games. In this case, each code is considered as an entrant and each circle in FIG. 14(B) is considered as a game. As can be appreciated, in such case, the number of games becomes number of entrant minus one. On the other hand, in the example of FIG. 15, since no table entry corresponding to the initial state is present, total number of entries becomes 2k−2=24. As can be appreciated herefrom, the size of the table is merely in the extent proportional to the number of codes.

FIGS. 16(A) and 16(B) are respectively a block diagram of a decoding circuit according to the first decoding system and a chart showing the structure of the variable length decoding table. As shown in FIG. 16(A), the decoding circuit includes a start address register 161 for storing a start address, an end address register 162 for storing an end data, a variable length decoding table 163 constituted of 12 bits×2K words, a data register 164 storing data read out from the variable length decoding table, a multiplexer (MPX) 165 for selecting one of respective 12 bits from the registers 161 and 164, an address register 166, a shift register 167, a shift control circuit 169 for controlling the shift register 167 and a decoding timing sequencer 170 for supplying a timing signal for respective components. As shown in FIG. 16(B), the variable length decoding table 163 is constituted of 11 bits of an upper address for continuing retrieval and 1 bit of a retrieval continuation designating portion. The 1 bit of retrieval continuation designating portion represents termination by "0" and continuation by "1". It should be noted that this structure is based on FIG. 15.

FIG. 17 is an operational timing chart of respective portions in FIG. 16(A). Here, the operational timing control is assumed to be performed by the decoding timing sequencer 170 and illustrated mainly in the operations of the data register 164, the shift register 167 and the address register 166.

The operation will be discussed hereinafter with reference to FIGS. 16(A), 16(B) and 17. It should be noted that the above-mentioned decoding timing sequencer 170 is a circuit for generating a timing signal associated with initiation, execution and termination of decoding, in concrete.

At first, 12 bits of an initial address is set in the start address register 161. This initial address passes the multiplexer 165. Then, the least significant bit of the initial address is replaced with a leading bit of the shift register 167 where data to be decoded is stored. Thereafter, the initial address is set in the address register 166. The content of the address register 166 is used for accessing the variable length decoding table 163. Data read out from the variable length decoding table 163 by assessing thereto is stored in the data register 164. At the same time, the shift register 167 is shifted for 1 bit toward left in FIG. 16(A). Next, the content of the data register 164 passes the multiplexer 165. The least significant bit of the content of the data register 164 past through the multiplexer is replaced with the leading bit of the shift register 167, in which data to be subsequently decoded is stored, and is set in the address register 166. The content of the address register 166 is again used for accessing the variable length decoding table 163. The foregoing sequence is repeated until "end" is judged, namely, completion of decoding of one code is recognized. In this example, the repeating unit corresponds one period of a reference clock as illustrated in FIG. 15.

On the other hand, information indicating whether retrieval is "completed" is written in the least significant bit of the variable length decoding table 163 (see FIG. 14(B)). This bit is read out as the least significant bit of the data register 164. The result is transmitted to the shift control circuit 169 and the decoding timing sequencer 170 past through the multiplexer 165. The shift control circuit 169 is the circuit for determining a shifting magnitude of the shift register 167 and serves for preventing shifting operation after completion of retrieval. Once retrieval is completed, data obtained as the result of table retrieval is stored in the end data register 162. The bit length of the variable length decoding table 163 is determined by the length of the end data and the address length necessary as the address of the table per se. The depth of the table is proportional to the number of code to be decoded, as set forth above.

Such first decoding system can make the circuit construction relatively simple by performing a process of 1 bit per 1 clock. However, it is not possible to realize the process performance of 2 or more bits per 1 clock.

FIG. 18 is a block diagram of the decoding circuit on the basis of the conventional second decoding circuit system. The circuit shown in FIG. 18 is so-called a shift comparison type decoding circuit. The decoding circuit includes a data register 182, a shift register 187, a shift control circuit 189, a decoding timing sequencer 190, a variable length decoding table 196, a code length table 197. The variable length decoding table 196 is constituted of 10 bits×128 words, and the code length table 197 is constituted of 3 bits×128 words.

Similarly to the foregoing first decoding circuit, in the shown decoding circuit, the decoding timing sequencer generates a timing signal associated with initiation, execution and termination of decoding. In conjunction with initiation of decoding, a plurality of bits of the shift register 187 are input to both of the variable length decoding table 196 and the code length table 197. It should be noted that these two tables may be composed into a single table. The variable length decoding table 196 recognizes the code contained in the input sequence and outputs corresponding data to the data register 182. On the other hand, the code length table 197 outputs a length of the code contained in the input sequence, namely, the shifting magnitude of the shift register 187 for the next shifting, to the shift control circuit 189. Therefore, in response to the next clock, shifting over number of bits corresponding to the code length is taken place in the shift register.

On the other hand, bit length of the decoding table 196 depends on the data length, and the bit length of the code length table 197 is determined by number of bits required for expressing the maximum code length with a binary number. The depth of these tables becomes $2^i$ assuming the maximum code length is i. Normally, in the variable length code, the number of code k frequently becomes much smaller than $2^i$. Therefore, the table becomes substantially long. Such second decoding system may achieve speeding of the circuit by performing decoding for one code per one clock. However, since the size of the table is proportional to the exponential function of the maximum code length to cause substantial increase of the memory capacity.

FIG. 19 shows a definition of the conventional variable length code. As shown in FIG. 19, such variable length code includes three data field. Namely, a field 1 represents row number, a field 2 represents data to be encoded and a field 3 represents a variable length code as a result of encoding. Here, as can be appreciated from the field 3, 114 data are encoded into 2 bit to 16 bit variable codes. Hereinafter, discussion will be given for the decoding circuit according to the first decoding system with respect to the variable length code set forth above.

FIG. 20 is a block diagram showing another example of the decoding circuit according to the foregoing first decoding system. As shown in FIG. 20, the decoding circuit comprises a decoding table memory 202, a decoding control sequencer 203, a decoded result data register 204, a shift register 206, a decoding start address register 209, a decoding table memory address register 210 and a multiplexer 218. On the other hand, the decoding table memory 202 is constituted of 17 bits×4K words.

FIG. 21 shows an Example of the decoding table to perform decoding. In the shown decoding table, the right column shows a bit indicative of the intermediate state or the completed state of decoding (0: completed, 1: incomplete state). The left column includes addresses of next table entries in case of the decoding incomplete state and the decoded meaning (positive integers in the shown case) in case of the decoding completed state. Decoding process is started at a start address "100000". Then, reference is made to the address "100000" if the leading bit of the code is "0", and to the address "100001" if the leading bit of the code is "1". For example, in case of the address "100001", since the right column is "1" to represents the decoding incomplete state and the left column is "100100" representing that the next address to access is the address "100100". Therefore, from the content of in the address "100001" of the shown table, it can be judged that decoding has to be continued with accessing the address "100100". At the address "100100", since the right column is "0" to represent the decoding completed state and the left column has a content value "000001". Form this, the results of decoding as positive integer "1" can be obtained.

Next, returning to FIG. 20, the operation of such decoding circuit will be discussed. It should be noted that the timing control for the operation discussed later is performed by the decoding timing sequencer 203. Namely, the decoding timing sequencer 203 generates timing signal associated with initiation, execution and termination of decoding. At first, the initial address is set in the initial address register 209. Then, the initial address passes the multiplexer 218 and its least significant bit is transmitted to the decoding sequencer 203. This is for performing judgement for completion of decoding. Furthermore, this least significant bit is replaced with the leading bit of the shift register 206 and set in the address register 210. In conjunction therewith, the shift register 206 shifts for 1 bit toward left.

After initiation of decoding, control is performed by the decoding sequencer 203 such that the newly accessed content of the decoding table memory 202 passes the multiplexer 218. The subsequent processes are the same as those set out above.

The foregoing sequence is repeated until a judgement "decoding is completed" is made. Once, retrieval is completed, data obtained as a result of retrieval of the decoding table is stored in the end data register 204. Thus, the first decoding system can be constructed with a relatively simple circuit construction by performing process for one bit per one clock similarly to the foregoing example. However, this cannot achieve the processing performance of two or more bits per one clock.

The above-mentioned first decoding system (FIGS. 16(A) and 16(B)) cannot realize the decoding performance of two or more bits per one clock. Therefore, this system encounters a defect in that it is difficult to apply for high speed decoding of the bit sequence. For example, in case of the decoding circuit constructed with typical CMOS LSI, it is difficult under current technology to apply for decoding of the bit sequence of 10 Mb/s or more.

On the other hand, in the above-mentioned conventional second decoding circuit (FIG. 18), for the maximum code length i, number of entry in the code length table becomes $2^i$ so that large memory capacity is required for decoding one variable length code. This may creates a problem of the area in consideration of designing of the decoding circuit as an integrated circuit. For instance, when i exceeds 16, the capacity of the table exceeds 64 Kwords. It the table size become greater than this, it should be defective for integrating. Namely, such type of memory has high redundancy as requiring writing of the identical content to a large number of entries. It may be possible to attempt logical optimization employing PLA (Programmable Logic Array) or so forth. However, even in such case, in consideration of sequential decoding of a plurality of variable length codes and appropriating of the hardware for a plurality of application, it becomes necessary to provide a plurality of PLA or to re-design the PLA adapting to each application to make design complicate. In addition, in view of the code having extraordinary maximum code length, the application of this system may cause difficulty not only in the code length table but in realization of the shift register.

Furthermore, the above-mentioned other example of the conventional first decoding system (FIG. 20), the decoding process performance of two or more bits per one clock cannot be realized. Namely, in decoding of the variable length code containing code having the maximum code length 16, 16 clock cycle is required in the worst case. Therefore, it causes difficulty in high speed decoding for the bit sequence. For example, in case of the decoding circuit constructed with typical CMOS LSI, it is difficult under current technology to apply for decoding of the bit sequence of 50 Mb/s or more.

SUMMARY OF THE INVENTION

Therefore, it is a first object of the present invention to provide a decoding circuit for a variable length code which can realize high speed decoding process performance with maintaining a size of a decoding table substantially corresponding to number of the codes.

A second object of the present invention is to provide a decoding system for a variable length code which can realize decoding process performance of two or more bits per one clock and the size of the decoding table merely two or three times of number of codes.

In order to accomplish the above-mentioned object, a variable length code decoding circuit, according to the present invention, comprises a shift register storing a bit sequence of variable bit length code variable of number of bits, decoding table storage means for storing data including an upper field selectively indicative of a meaning of the code and an address for next access, selected depending upon a state transition upon decoding the variable bit length code per n bits, in which n is an integer greater than or equal to two, an intermediate field indicative of a shifting magnitude of the shift register upon completion of decoding, and a lower field indicative of a state of code decoding, a shift control means for shifting the bit sequence of the variable bit length code in a magnitude corresponding to a shifting magnitude indicated in the intermediate field when data indicative of the code decoding state in the lower field of the data read out from the decoding table storage means indicates completion of decoding and corresponding to n bits when the data indicative of the code decoding state in the lower field indicates continuation of decoding, and means for generating an address for accessing the decoding table storage means by replacing the intermediate field and the lower field of data read out from the decoding table storage means with leading n bits of the shift register.

Preferably, the lower field of the decoding table storage means is data of one bit.

In another preferred construction, the variable length code decoding circuit further comprises an initial data register for storing one specific data having the same structure to the data stored in the decoding table storage means and providing the specific data to the address generating means in place of the data read out from the decoding table storage means upon initiation of decoding of the code. In yet another preferred construction, the variable length code decoding circuit further comprises an end data register for storing the content of the upper field of the read out data as a result of decoding when the data indicative of the code decoding state in the lower field of the data read out from the decoding table storage means indicates completion of decoding.

In order to accomplish the above-mentioned objects, another variable length code decoding circuit, according to the present invention, comprises a shift register storing a bit sequence of variable bit length code variable of number of bits, decoding table storage means for storing data including an upper field selectively indicative of a meaning of the code and an address for next access, selected depending upon a state transition upon decoding the variable bit length code per n bits which n is an integer greater than or equal to two, an intermediate field indicative of a shifting magnitude of the shift register upon completion of decoding, and a lower field indicative of a state of code decoding, the upper and intermediate field containing data indicative of an address for next access, and a plurality of the being divided into blocks of a size of $2^n$ and blocks of lesser size, a shift control means for shifting the bit sequence of the variable bit length code in a magnitude corresponding to a shifting magnitude indicated in the intermediate field when data indicative of the code decoding state in the lower field of the data read out from the decoding table storage means indicates completion of decoding and corresponding to n bits when the data indicative of the code decoding state in the lower field indicates continuation of decoding, and address designating means for selecting number of bits for designating address in the block depending upon the size of block on the basis of leading n bits of the shift register, and means for generating an address for accessing the decoding table storage means by replacing the lower bits of the upper field and the intermediate field of data read out from the decoding table storage means with leading n bits of the shift register.

A further variable length code decoding circuit, according to the present invention comprises a shift register storing a bit sequence of variable bit length code variable of number of bits, decoding table storage means for storing data including an upper field selectively indicative of a meaning of the code and an address for next access, selected depending upon a state transition upon decoding the variable bit length code per n bits which n is an integer greater than or equal to two, an intermediate field indicative of a shifting magnitude of the shift register upon completion of decoding, and a lower field indicative of a state of code decoding, shift control means for shifting the bit sequence of the variable bit length code in the shift register for a shifting magnitude indicated in the intermediate field of data read out from the decoding table storage means, an initial data register storing an initial data having the same structure to data stored in the decoding table storage means and outputting the initial data every time of completion of decoding for one code, means for designating leading m bits of the shift register, which m is an integer smaller than or equal to n, depending upon the value in the intermediate field of one of the initial data and the data read out from the decoding table storage means, and means for generating an address for accessing the decoding table storage means by replacing the lower side of the initial data of the initial data register with the leading m bits of the shift register designated by the designating means upon initiation of decoding and by replacing the lower side of the upper field of data read out from the decoding table storage means with leading m bits of the shift register.

A still further variable length code decoding circuit, according to the present invention, comprises a shift register storing a bit sequence of variable bit length code variable of number of bits, decoding table storage means for storing data including an upper field selectively indicative of a meaning of the code and an address for next access, selected depending upon a state transition upon decoding the variable bit length code per n bits which n is an integer greater than or equal to two, an intermediate field indicative of a shifting magnitude of the shift register upon completion of decoding, and a lower field indicative of a state of code decoding, shift control means for shifting the bit sequence of the variable bit length code in the shift register for a shifting magnitude indicated in the intermediate field of data read out from the decoding table storage means, leftmost one detecting means for searching leading k bits, which k is a positive integer, of the shift register and detecting a bit position where a bit containing "1" appears at first among the k bits, shift control means for shifting the bit sequence of the variable bit length code in the shift register for one of shifting magnitude indicated in the intermediate field of data read out from the decoding table storage means and shifting magnitude corresponding to the detected value of the leftmost one detecting means, an initial data register storing an initial data having the same structure to data stored in the decoding table storage means and outputting the initial data every time of completion of decoding for one code, means for designating leading m bits of the shift register, which m is an integer smaller than or equal to n, depending upon the value in the intermediate field of one of the initial data and the data read out from the decoding table storage means, adding means for adding the detected value of the leftmost one detecting means to the initial data of the initial data register, and means for generating an address for accessing the decoding table storage means with the added value of the adding means upon initiation of decoding and by replacing the lower side of the upper field of data read out from the decoding table storage means with leading m bits of the shift register.

A yet further variable length code decoding circuit, according to the present invention, comprises a shift register storing a bit sequence of variable bit length code variable of number of bits, decoding table storage means for storing data including an upper field selectively indicative of a meaning of the code and an address for next access, selected depending upon a state transition upon decoding the variable bit length code per n bits which n is an integer greater than or equal to two, an intermediate field indicative of a shifting magnitude of the shift register upon completion of decoding, and a lower field indicative of a state of code decoding, an initial data register storing an initial data having the same structure to data stored in the decoding table storage means and outputting the initial data every time of completion of decoding for one code, leftmost one detecting means for searching leading k bits, which k is a positive integer, of the shift register and detecting a bit position where a bit containing "1" appears at first among the k bits, shift control means for shifting the bit sequence of the variable bit length code in the shift register for one of shifting magnitude indicated in the intermediate field of data read out from the decoding table storage means and shifting magnitude corresponding to the detected value of the leftmost one detecting means, means for designating leading m bits of the shift register, which m is an integer smaller than or equal to n, depending upon the value in the intermediate field of one of the initial data and the data read out from the decoding table storage means, and means for generating an address for accessing the decoding table storage means by replacing lower side of the initial data with the detected value of the leftmost one detecting means upon initiation of decoding and by replacing the lower side of the upper field of data read out from the decoding table storage means with leading m bits of the shift register.

In respective inventions, the variable length code decoding circuit may further comprise an end data register for storing the content of the upper field of the read out data as a result of decoding when the data indicative of the code decoding state in the lower field of the data read out from the decoding table storage means indicates completion of decoding.

Other objects, feature and effect of the present invention will be made more clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIG. 2 is an illustration showing a decoding table on the basis of the state transition illustrated in FIG. 1(B);

FIG. 4 is an illustration showing another decoding table based on the state transition for discussing the second embodiment of the invention;

FIG. 9 is an illustration showing a variable length code decoding table in FIG. 8;

FIG. 10 is an illustration showing a variable length code decoding table in FIG. 8;

FIG. 12 is an illustration showing a variable length code decoding table according to a decoding system of FIG. 11;

FIG. 15 is an illustration showing the conventional variable length decoding table;

FIG. 17 is a timing chart showing operations of various portion in the decoding circuit of FIG. 16;

FIG. 19 is an illustration of a definition of the conventional variable length code;

FIG. 21 is an illustration showing an example of a decoding table upon performing decoding.

DESCRIPTION OF THE PREFERRED EMBODIMENT

The preferred embodiments of the present invention will be discussed in detail with reference to the accompanying drawings. At first, detailed discussion will be given for a decoding system realized by the first embodiment of the invention with reference to FIGS. 1(A), 1(B) and FIG. 2.

Figure 1A:
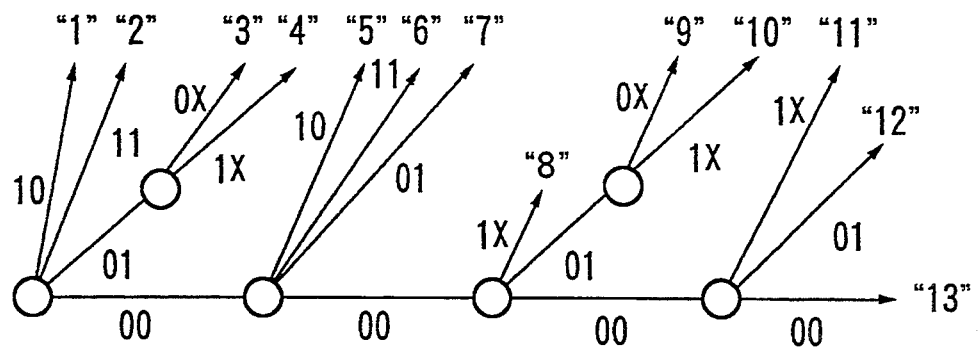
FIGS. 1(A) and 1(B) are illustrations showing state transition in decoding for every two bits and every three bits for a variable length code, for discussion of the first embodiment of the present invention.
Figure 1B:
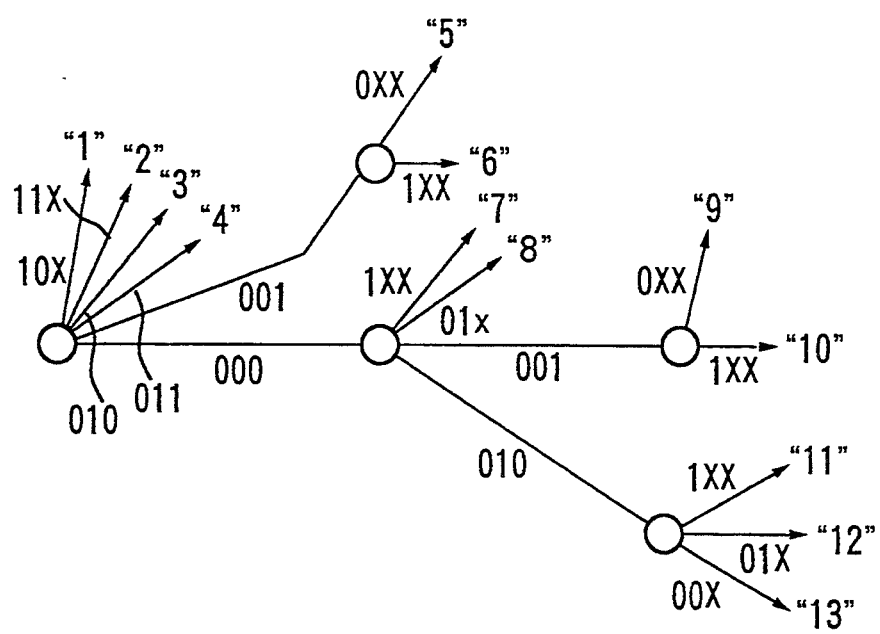
Figures 14A, 14B:
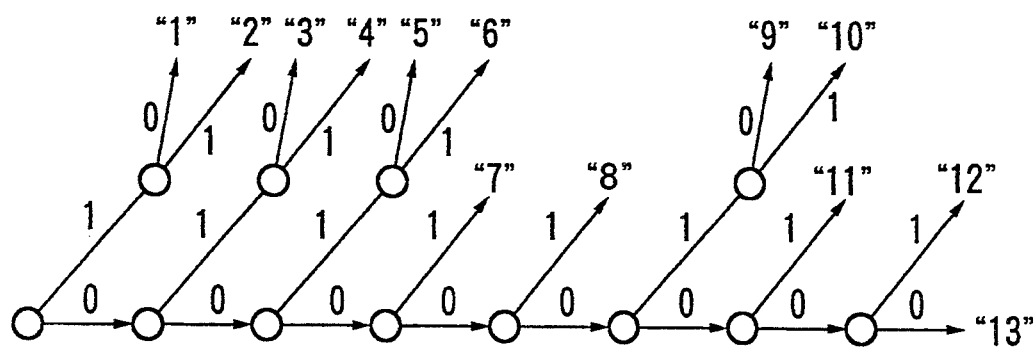
FIGS. 14(A) and 14(B) are illustrations respectively showing a variable length coding table for detailed discussion of the conventional first decoding circuit system and a state transition with a binary tree.
Figure 16A:
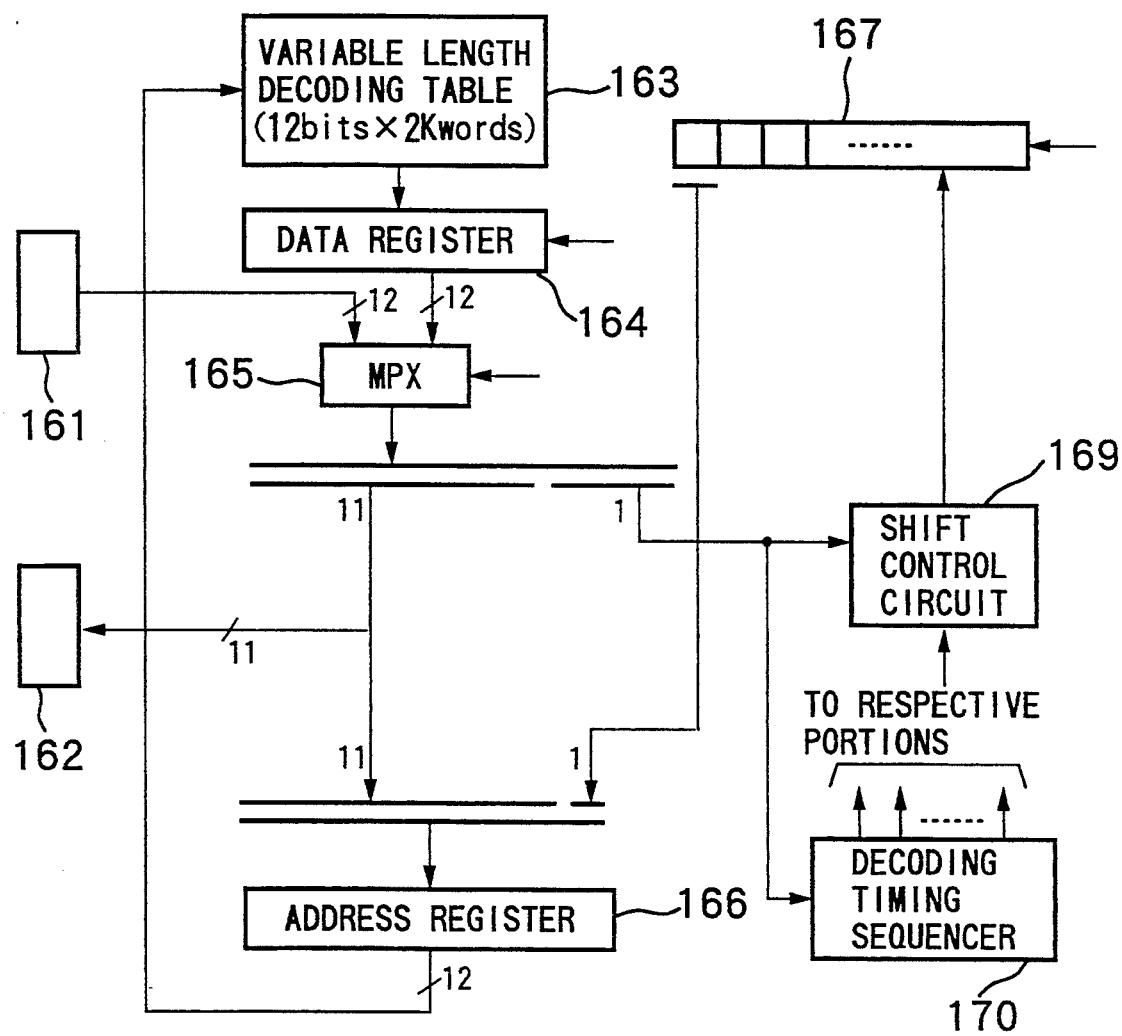
FIGS. 16(A) and 16(B) are respectively a block diagram of a decoding circuit of the conventional first decoding system and an illustration showing a structure of the variable length table.
Figure 16B:
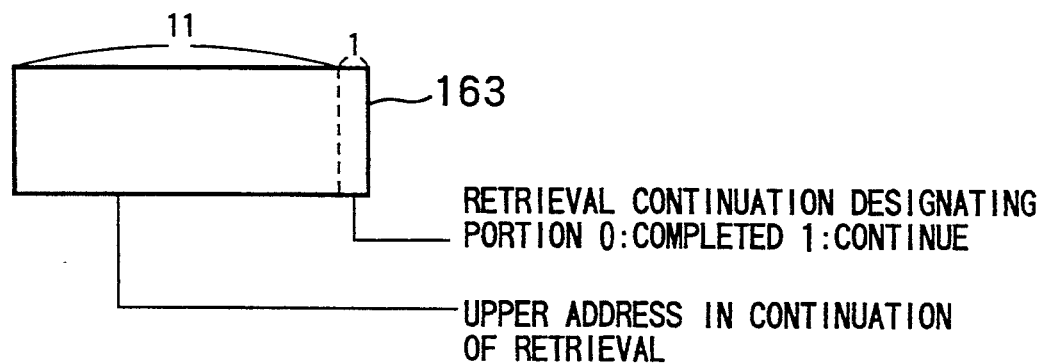
Figure 18:
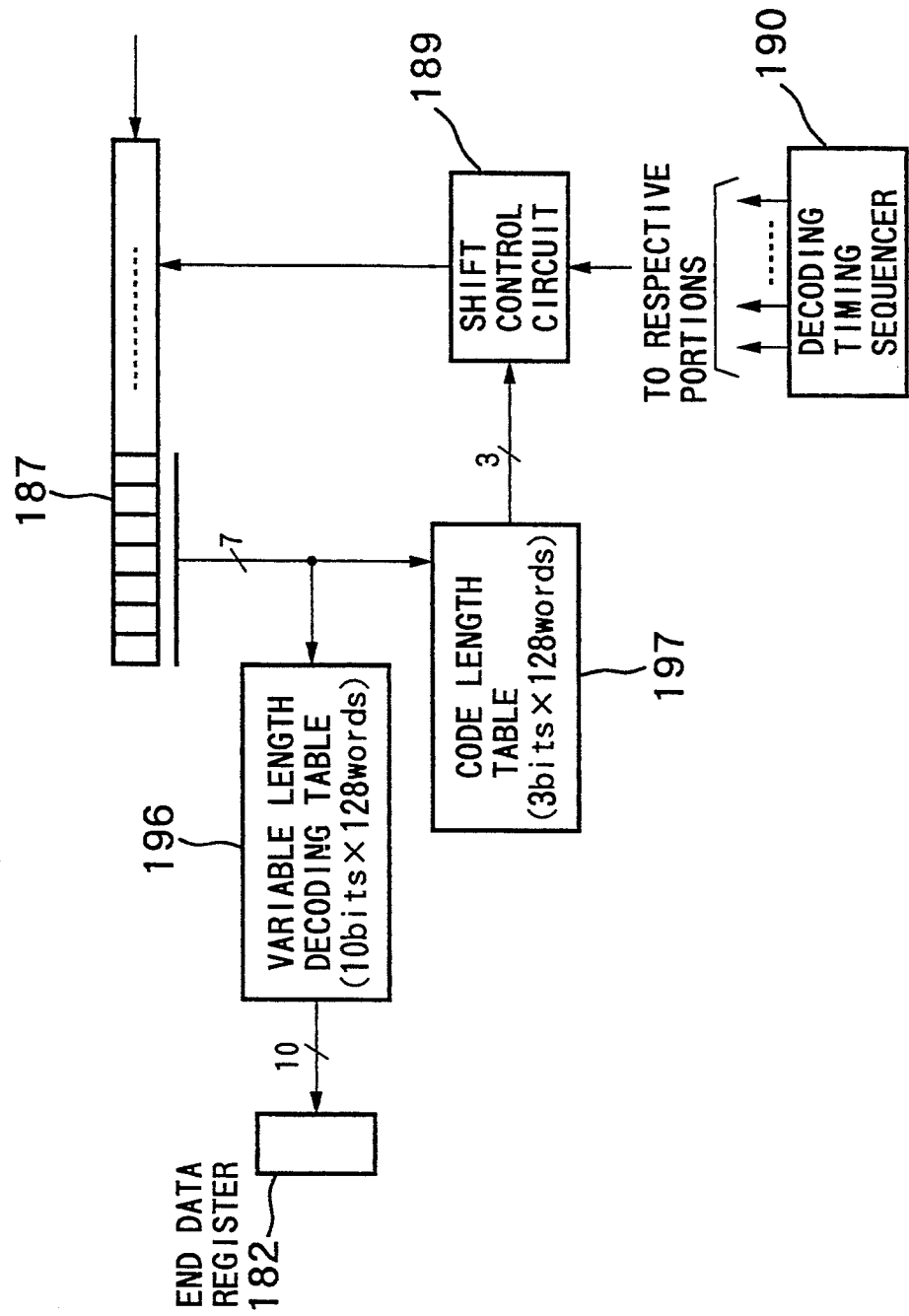
FIG. 18 is a block diagram of the decoding circuit according to the conventional second decoding circuit system.
Figure 20:
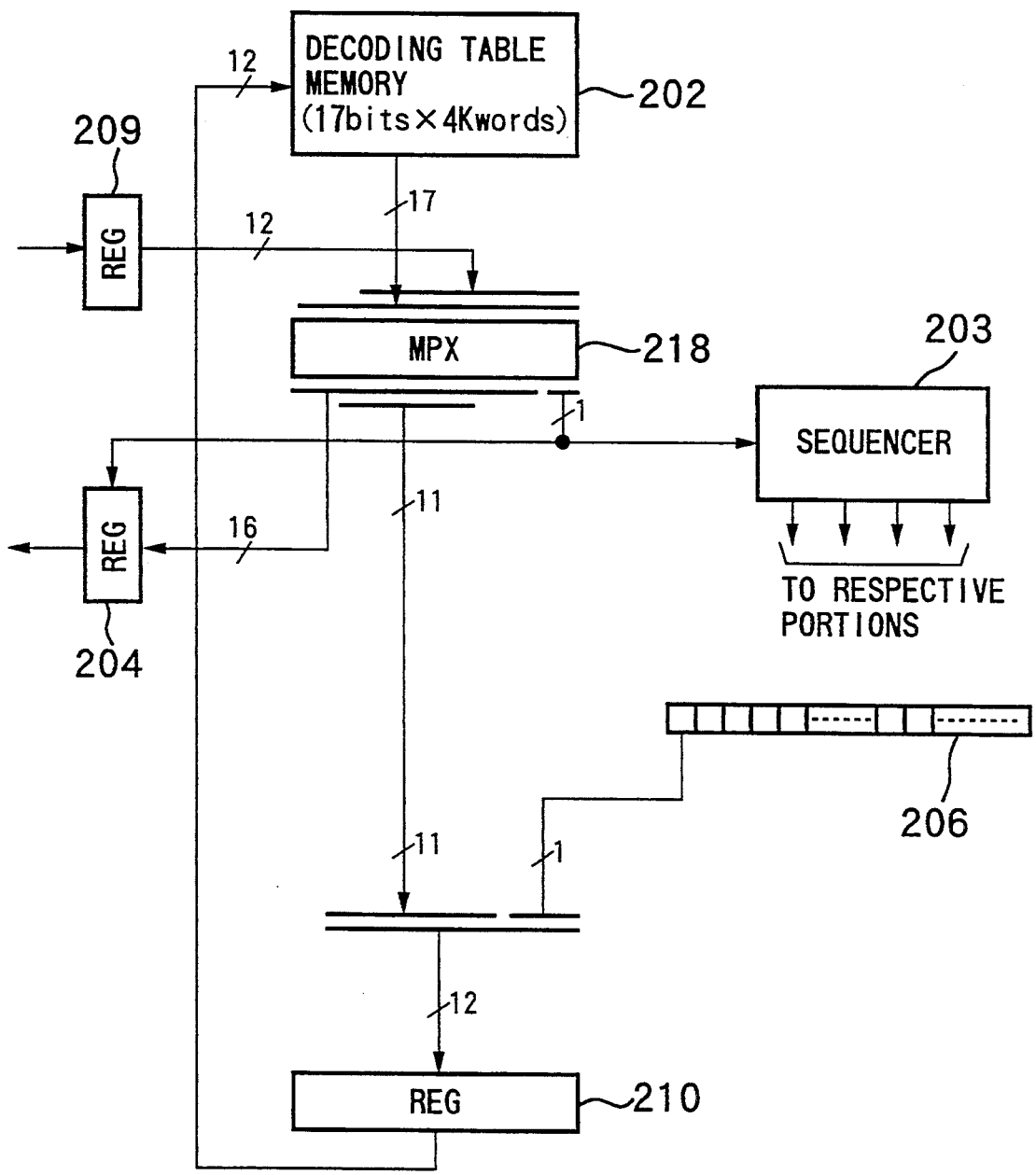
FIG. 20 is a block diagram of the another example of a decoding circuit according to the conventional first decoding system.

FIGS. 1(A) and 1(B) show respective transition states in code decoding per two bits employing 2-3-4 notation tree and in code decoding per three bits employing 2-3-4-5-6-7-8 notation tree, and FIG. 2 shows a decoding table on the basis of the state transition as illustrated in FIG. 1(B) with respect to a variable length code illustrated and discussed with respect to FIG. 14(A).

At first, discussion will be given for the state transition illustrated in FIG. 1(A). The shown transition state illustrates process of decoding per two bits in order from the left with respect to the code given by FIG. 14(A). In this case, similarly to FIG. 14(B), the circles represent the initial and intermediate state during decoding. Upon initiation of decoding, the process is started from the leftmost circle. If the first two bits in decoding are "00", the process is branched to a branch (arrow) of "00", and if "01", the process is blanched to a branch of "01". A branch "0x" includes both of the branches of "00" and "01". x represents redundancy. On the other hand, in the transition staten illustrated on FIG. 1(B) shows the process for decoding per three bits for the code given by FIG. 14, in order from left.

Next, a decoding table shown in FIG. 2 realizes the state transition in FIG. 1(B). The right column represents a continuing state and a completed state of decoding (0: completed, 1: incomplete). On the other hand, the left column shows a next table entry when decoding is continued and a meaning (here, the positive integer) of the decoded code when decoded is completed. In this system, the code is decoded by shifting per three bits. In this case, the code length is not always three times longer. Therefore, it becomes necessary to adjust the fraction. The fraction appears as a redundant term x in FIG. 2. This x means overlapping of the leading portion of the next code. Therefore, to prevent this portion from being shifted out, number of shifting has to be reduced. The central column in FIG. 2 represents a field for designating a code shifting magnitude at completion of decoding. The designation is made upon completion of decoding. Therefore, the central field is used for adjusting the shifting magnitude. Namely, in this column, 01 represents the shifting magnitude for one bit, 10 represents the shifting magnitude for two bits and 00 and 11 represents the shifting magnitude for three bits.

Figure 3A:
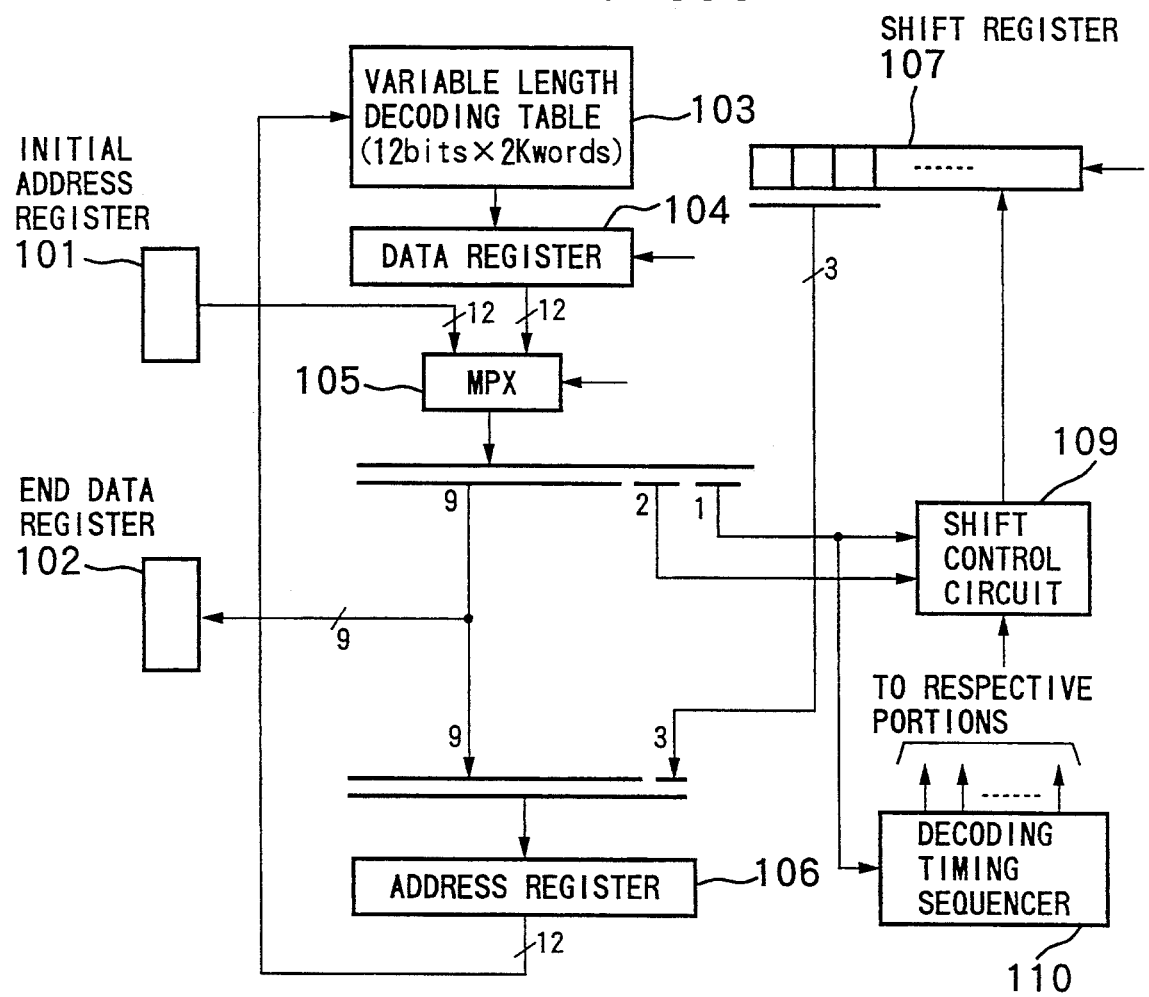
FIGS. 3(A) and 3(B) are illustrations respectively showing the first embodiment of a variable length code decoding circuit according to the invention and a variable length decoding table.
Figure 3B:
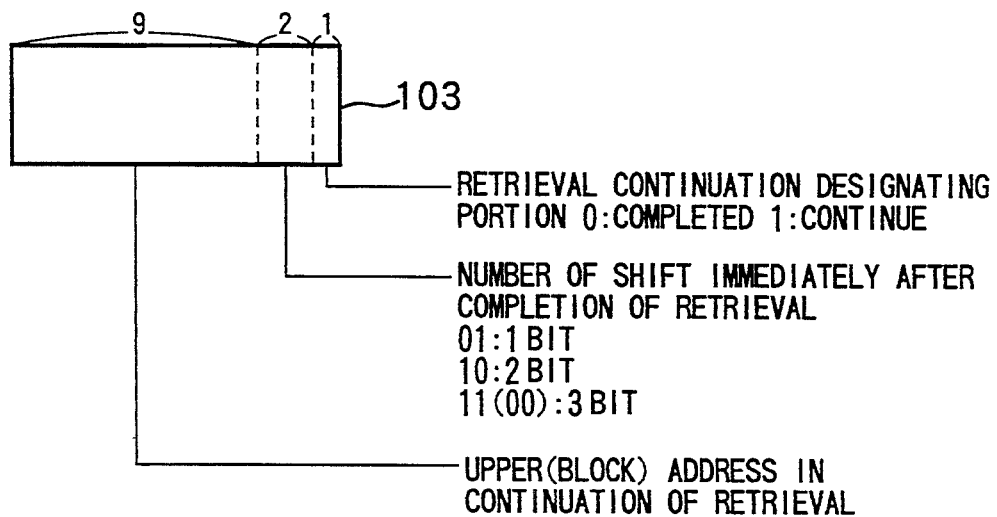

FIGS. 3(A) and 3(B) respective show a block diagram of the first embodiment of the decoding circuit according to the invention and a structure of a variable length decoding table. As shown in FIG. 3(A), the decoding circuit includes an initial address register 101, an end data register 102, a variable length decoding table 103 having a structure of 12 bits×2 Kwords, a data register 104 for storing data read out from the table 103, a multiplexer 105 for inputting 12 bit data of the data register 104, a shift register 107, an address register inputting the leading three bits from the shift register 107 and 9 bit from the multiplexer 105 for generating an address for the table 101, a shift control circuit 109 for controlling the shifting magnitude of the shift register 107, and a decoding timing sequencer 110. On the other hand, as shown in FIG. 3(B), the variable length decoding table 103 includes a retrieval continuation designating portion of one bit and nine bits of data representative of shifting number immediately after completion of decoding and of upper (block) address when the retrieval is to be continued. It should be noted that the operational timing of the circuit of FIG. 3(A) is the same as the timing of the circuit of FIG. 17 set forth above.

Next, operation of such decoding circuit will be discussed. It should be appreciated that the timing control set forth below is performed by the decoding timing sequencer 110. Namely, the decoding timing sequencer 110 generates timing signals associated with initiation, execution and termination of the decoding process. At first, an initial address is set in the initial address register 101. This initial address is expressed in the same format to the variable length table 103 and passes the multiplexer 105. At this time, the lower three bits of the initial address is related with the leading three bits of the shift register 107, in which the data to be decoded is stored, and set in the address register 108. The content of the address register 108 is used for accessing the decoding table 103. Data in the decoding table corresponding to the address of the address register 106 is read out and set in the data register 104. At the same time, the variable length code stored in the shifted register 107 is shifted over three bits under the control of the shift control circuit 109.

Then, the content of the data register 104 passes the multiplexer 105. The lower three bits are again replaced with the leading three bits of the shift register and set in the address register 108. The content of the address register 106 is again used for accessing the decoding table 103.

The foregoing sequence is repeated until "Completion" is judged, i.e. until one code is decoded. In this example, the repeating unit is one period of a reference clock. The "information" whether the decoding is completed or not is written in the least significant bit of the decoding table (see FIG. 3(B)). This is read out as the least significant bit of the data register 104. The result is transmitted to the shift control circuit 109 and the decoding timing sequencer 110 through the multiplexer 105. The shift control circuit 109 determined the shifting magnitude of the shift register 107.

Once retrieval is completed, the data thus obtained as a result of retrieval is stored in the end data register 102. On the other hand, the shifting magnitude of the shift register 107 is transmitted to the shift control circuit 109 so as to respond to shifting for less than or equal to 3 bits upon completion. In short, this decoding system can accelerate the process by performing maximum three bits per one clock.

On the other hand, the bit length of the decoding table 103 is determined by the length of the end data and the address length necessary for address of the table 103 per se. Also, the left field of FIG. 2 always become zero at the lower three bits in the decoding incomplete condition. Namely, eight table entries form a set for one continuing state (hereafter referred to as "block"). An offset to the leading address is provided by the shift register 107. Therefore, the redundant three bits may be eliminated from the decoding table 103. Furthermore, in the decoding continuing condition, attention should be paid for the fact that the central field is not used. With utilizing these two points, bit length of the decoding table can be reduced. It should be noted that the depth of the table is 8 times of the number of continuing conditions, as can be clear from FIG. 1(B) and FIG. 2. Since the number of continuing condition will never exceed the number of codes, number of the table entries is merely multiple of the number of codes.

Next, a decoding system realized by the second embodiment of the present invention will be discussed with reference to FIG. 4. FIG. 4 shows another decoding table based on the transition state of FIG. 1(A). FIG. 1(B) shows the process of decoding, in which the code given in the prior art of FIG. 14(A) is decoded per three bits in order from the left. However, when this transition diagram is directly realized in a form of the table, there appears highly redundant portions. For instance, in the third block (address 01100000) in FIG. 2, respective four entries are used for obtaining the result of decoding of "5" and "6". This is because the process along the 8 notation tree by the three bit decoding is realized on the table as it is and thus 8 conditions is used even in discrimination for two conditions in binary tree.

Therefore, in the decoding table illustrated in FIG. 4, measure is taken to eliminate such redundancy as much as possible. Namely, by eliminating redundancy of respective blocks in FIG. 2, third and fourth blocks are reduced into two entries and the fifth block is reduced to four entries, as shown in FIG. 4.

In FIG. 4, the right column indicates the decoding continuing state or completed state (00: completed state), and designates the sizes of respective block (01: block=2 entries, 10: block=4 entries, 11: block=8 entries). By this, the entries in the third block can be reduced into two, for example and thus redundant setting of the table region can be avoided. Also, in case of the decoding continuing state, the left and central columns of FIG. 4 indicate the address of the next table entry. Furthermore, when decoding is completed, the left column indicates the meaning (here, positive integer) of the decoded code, and the central column indicate the code shifting magnitude upon completion of decoding. In this method, the depth of the table can be significantly improved with maintaining the equivalent performance to the system, in which decoding is performed with shifting the code per three bits. For instance, the decoding table having 40 entries in FIG. 2 can be reduced into 24 entries in FIG. 4. This is because that the depth of the table is equivalent to that of the table (FIG. 15) for retrieval with the binary tree.

Figure 5:
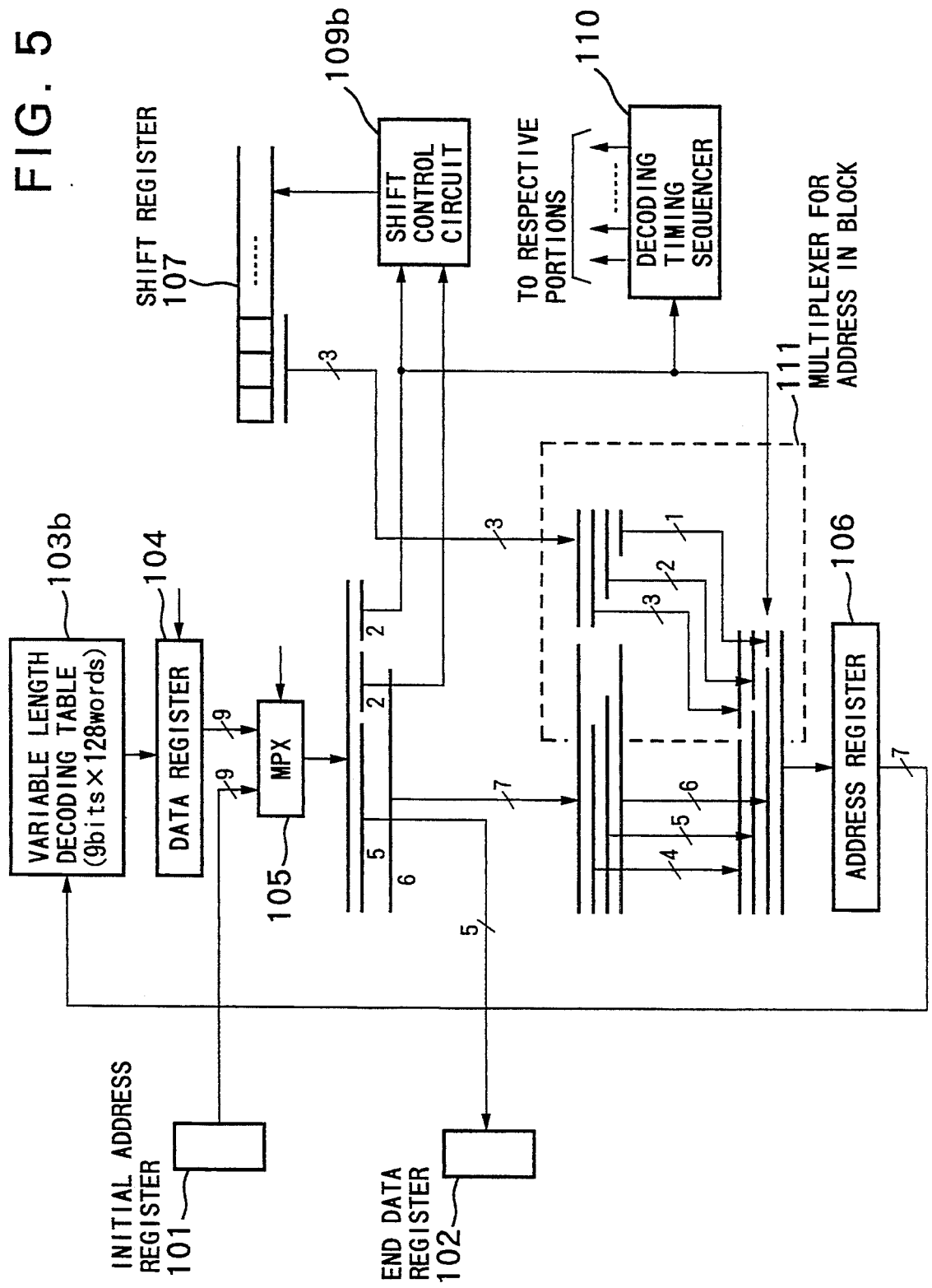
FIG. 5 is a block diagram of the second embodiment of a variable length code decoding circuit of the invention.

Next, discussion will be given for such second embodiment with reference to the drawings. FIG. 5 is a block diagram of the second embodiment of the decoding circuit of the invention. The shown embodiment of the decoding circuit includes the initial address register 101, the end data register 102, a variable length decoding table 103$b$, the data register 104, the multiplexer 105, an address register 106, a shift register 107, a shift control circuit 109, a decoding timing sequencer 110, and a multiplexer 111 for an address in the block. The variable length decoding table 103$b$ has a structure of 9 bits × 128 words.

Figure 6A:
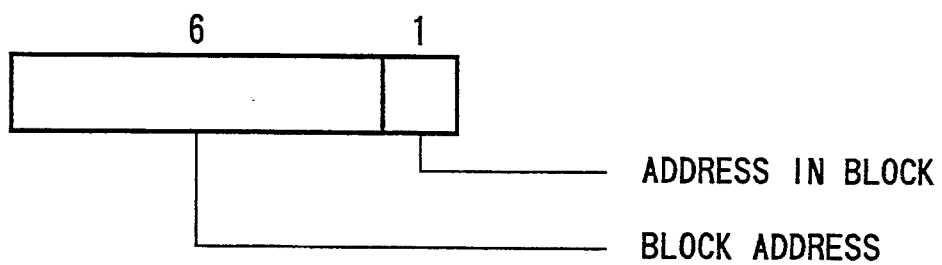
FIGS. 6(A)-6(C) are illustrations showing address constructions designating a block supported by FIG. 5.
Figure 6B:
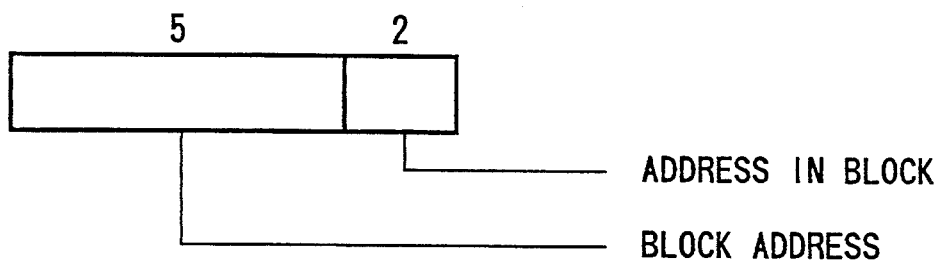
Figure 6C:
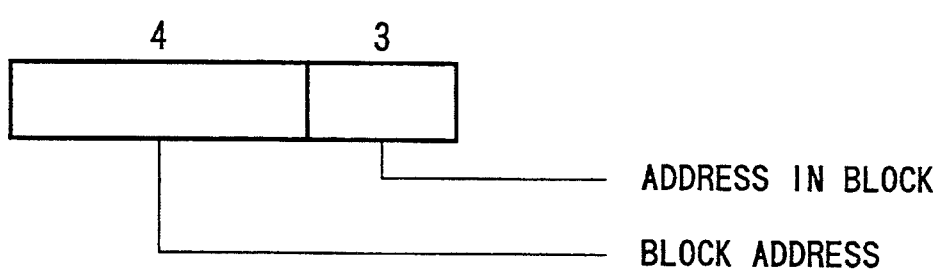

On the other hand, FIGS. 6(A)~6(C) show a content of the address designating the block supported by the decoding circuit of FIG. 5. FIG. 6(A) shows an address structure for designating a block of two words (entries), in which upper 6 bits indicate a block address and lower 1 bit represents an address within the block. FIG. 6(B) shows an address structure designating a block of four words (entries), in which upper 5 bit represent the block address and lower 2 bits represent the address within the block. FIG. 6(C) is an address structure for designating a block of 8 words (entries), in which upper four bits represent the block address and lower three bits represent the address within the block.

Figure 7:
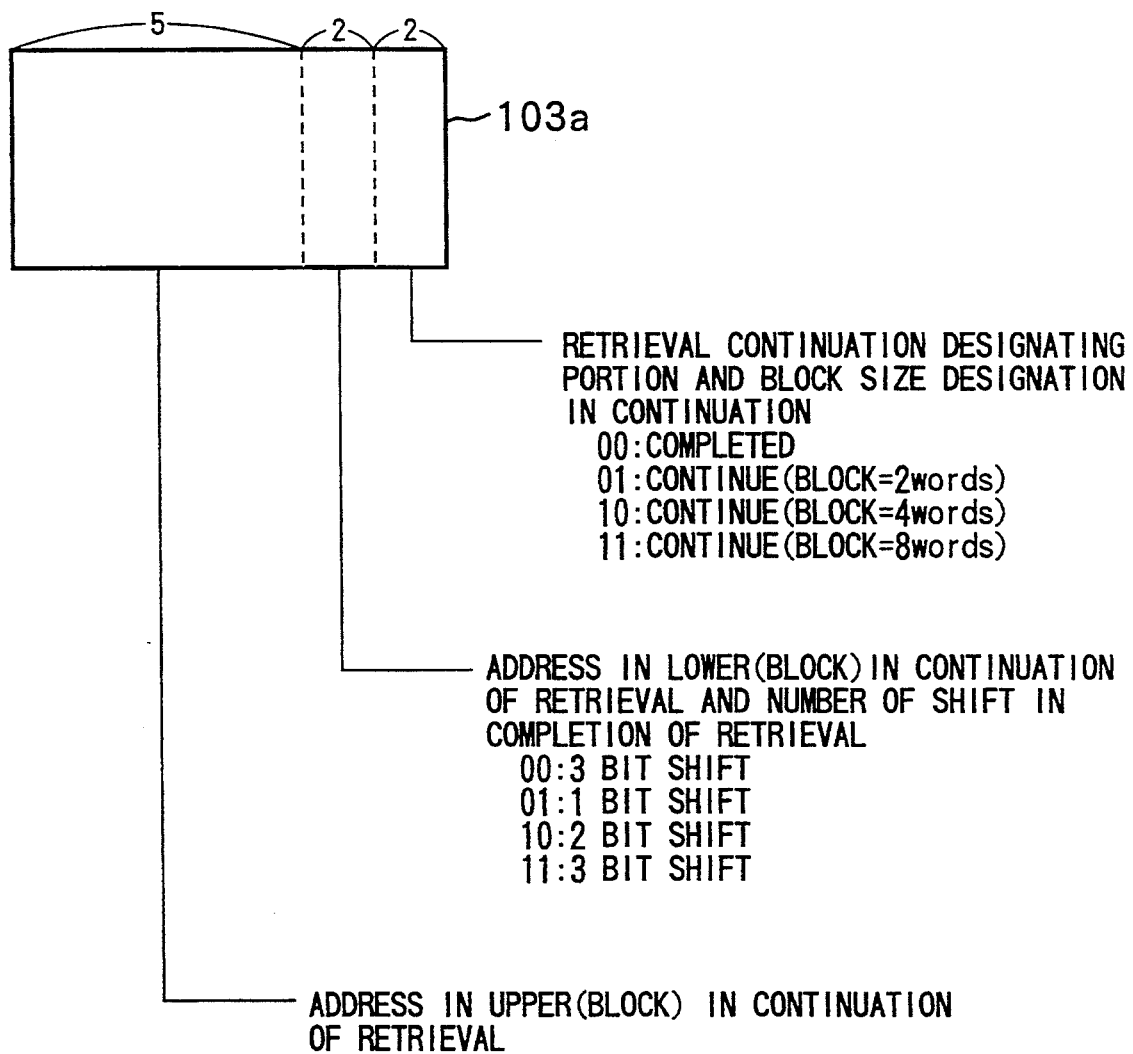
FIG. 7 is an illustration showing a structure of the variable length table shown in FIG. 5.

FIG. 7 shows a structure of the variable length table shown in FIG. 5. As shown in FIG. 7, the decoding table 103$b$ is based on the foregoing FIG. 4. It should be noted that the operation timing of the decoding circuit of FIG. 5 may be considered sa similar to the timing of the above-mentioned decoding circuit of FIG. 17.

Next, the circuit operation of the second embodiment of the decoding circuit will be discussed with reference to FIG. 5. It should be noted that the timing control of the operation set out below is performed by the decoding timing sequencer 110. Namely, the decoding timing sequencer 110 generates the timing signal associated with initiation, execution and termination of the decoding process.

At first, the initial address is set in the initial address register 101. This initial address is expressed in the same format to the variable length table 103$b$. The initial address passes the multiplexer 105, and the lower three bits are replaced with the leading three bits of the shift register 107 storing the data to be decoded. In advance thereto, the range of replacement is designated by the multiplexer 111 for the address within the block.

Namely, when two bits of lower field of the data output from the multiplexer 105 is "01", the least significant bit of the block address consisted of upper seven bits is replaced with the leading one bit of the shift register 107. On the other hand, when two bits of the lower field of the data is "10", lower two bits of the block address consisted of upper seven bits are replaced with leading two bits of the shift register 107. Also, when the two bits of lower field of the data is "11", lower three bits of the seven bit block address are replaced with the leading three bits of the shift register 107.

The address thus replaced is set in the address register 106. The content of the address register 106 is used for accessing the decoding table 103$b$. The result of access is set in the data register 104. At the same time, the shift register 107 is shifted toward left in the number of bits designated by two bits of lower fields. The content of the data register 104 passes the multiplexer 105 and the lower three bits thereof are replaced with the leading three bits of the shift register 104 and set in the address register 106. The content of the address register 106 is again used for accessing the decoding table 103.

The foregoing sequence is repeated until "completion" is judged, i.e. completion of decoding of one code is recognized. It should be noted that the unit of repetition of the foregoing process corresponds to one period of the reference clock.

The information indicating whether retrieval is "completed" or not is written in the lowest field of the decoding table 103$b$. This information is read out as the lowest field of the data register 104. The result is then transmitted to the shift control circuit 109$b$ and the decoding timing sequencer 110. By this, the shift control circuit 109$b$ determines the shifting magnitude of the shift register 107. Once retrieval is completed, data obtained as the result of retrieval on the table is stored in the end data register 102. On the other hand, the shifting magnitude of the shift register at completion of retrieval is transmitted to the shift control circuit 109$b$ by two bits of center field of the output of the multiplexer 105 so that the shift control circuit 109$b$ may response to shift less than or equal to three bits.

In short, the shown embodiment of the decoding circuit can accelerate the decoding process by processing maximum three bits per one clock and maintain the size of table small. The bit length of the decoding table 103$b$ is determined by the length of the end data and the address length necessary for the address of the table per se. The central field is not used in the decoding continuing (incomplete) state. Therefore, a sub-block address can be written in the central field. The depth of the table is clearly smaller than that in the foregoing first embodiment. Therefore, the number of the table entries is merely a multiple of the number of codes.

Figure 8:
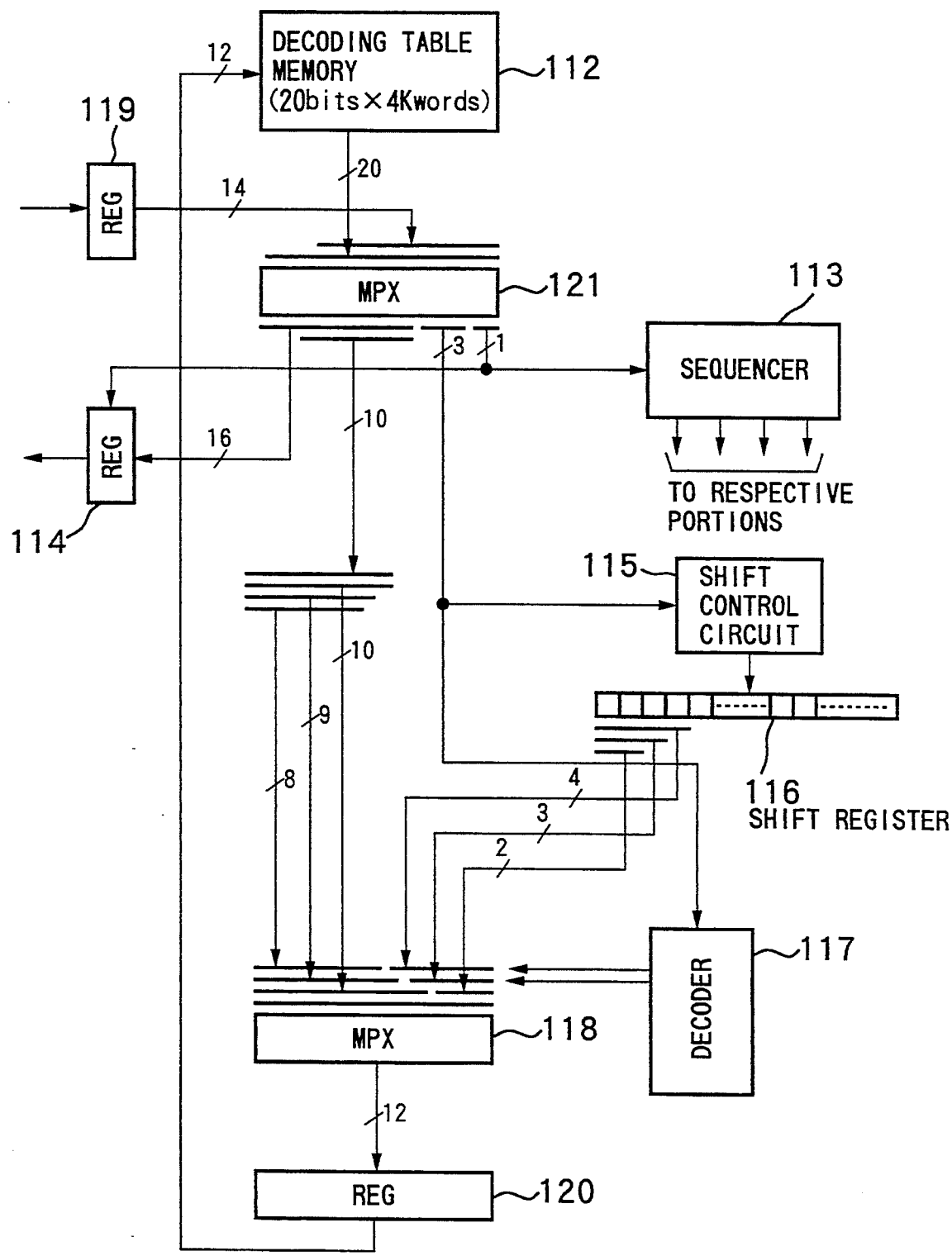
FIG. 8 is a block diagram of the third embodiment of a variable length code decoding circuit of the invention.

FIG. 8 is a block diagram of the third embodiment of a decoding circuit of the invention. As shown in FIG. 8, the decoding circuit includes a decoding table memory 112, a decoding control sequencer 113, a decoding resultant data register 114, a decoding initial address register 119, a shift control circuit 115, a shift register 116, a shifting magnitude decoder 117, a multiplexer 118 of three inputs and one output, a multiplexer 121 of two inputs and one output, and a decoding table memory address register 120. Amongst, the decoding table memory 112 has a capacity of 20 bit×4 KW.

FIGS. 9 and 10 show decoding tables for variable length codes in FIG. 8. As shown in FIGS. 9 and 10, the decoding table has four data fields, and is used for decoding the variable length code given in the foregoing FIG. 19 employing the decoding circuit of FIG. 8. In this decoding table, a field 1 represents a row number (including 0), a field 2 (when a field 4="1") represents a row number of the table to be retrieved in the next cycle, and (when field 4="0") represents an encoded data, a field 3 represents a shifting magnitude of the input system for next retrieval, and the field 4 indicates whether decoding is completed ("0") or not ("1").

Next, the operation of shown embodiment will be discussed with reference to FIG. 8. It should be noted that the operational timing control is performed by the decoding timing sequencer 113. Namely, the decoding timing sequencer 113 generates a timing signal associated with initiation, execution and termination of decoding.

At first, the initial address is set in the initial address register 119. The initial address is expressed in the identical format to each row of the decoding table shown in FIGS. 9 and 10. In the shown example, it is assumed that an upper field (10 bits) of the initial address is 0, an intermediate field (3 bits) is 4 and a lower bit (1 bit) is 1. The initial address passes the multiplexer 121. Then, the intermediate data field is transmitted to the decoder 117 as a selection signal of the multiplexer 118.

On the other hand, the shift control circuit 115 is not active with respect to the initial address. In order to form twelve bits of address of the decoding table memory, the leading four bits are taken from the shift register 116 and remaining eight bits are taken from the upper bits of the upper field of the initial address on the basis of the output of the decoder. This selection is performed by the multiplexer 118. The next decoding table memory address finally obtained is stored in the register 120.

In the next cycle, the content of the decoding table memory accessed according to the address of the register 120 passes the multiplexer 121. At this time, the sequencer 113 makes judgement that decoding is completed when the lower field of the given decoding table is "0". On the other hand, the shift control circuit 115 operates the shift register 116 to cause shifting in the magnitude corresponding to the value in the intermediate field of the given decoding table. A bit sequence given to the multiplexer 118 by the shift register 116 is controlled to be the leading end of the bit sequence after shifting. The upper field and the bit sequence are coupled in the same manner as that for the initial address.

The foregoing sequence is repeated until judgment of completion of decoding is made. Once retrieval is completed, data obtained as a result of retrieval against the decoding table is stored in the end data register 114. Even at completion of retrieval, shifting by the shift register 116 is effected so as to respond to the initial state of the next decoding.

The features of the above-mentioned decoding circuit is capability of decoding up to maximum n bits (n is greater one of maximum shifting magnitude allowed by the shift register and the maximum number which can be designated in the intermediate field of the decoding table memory). Namely, the decoding table of FIGS. 9 and 10 is designed to perform decoding by dividing the maximum length code (length 16) in the valuable length code shown in the field 3 of the code table in FIG. 19, into five, i.e. 4+4+4+2+2 (similar for other codes). Therefore, with the decoding table of FIGS. 9 and 10, decoding can be completed in five cycles in the worst case.

Figure 11:
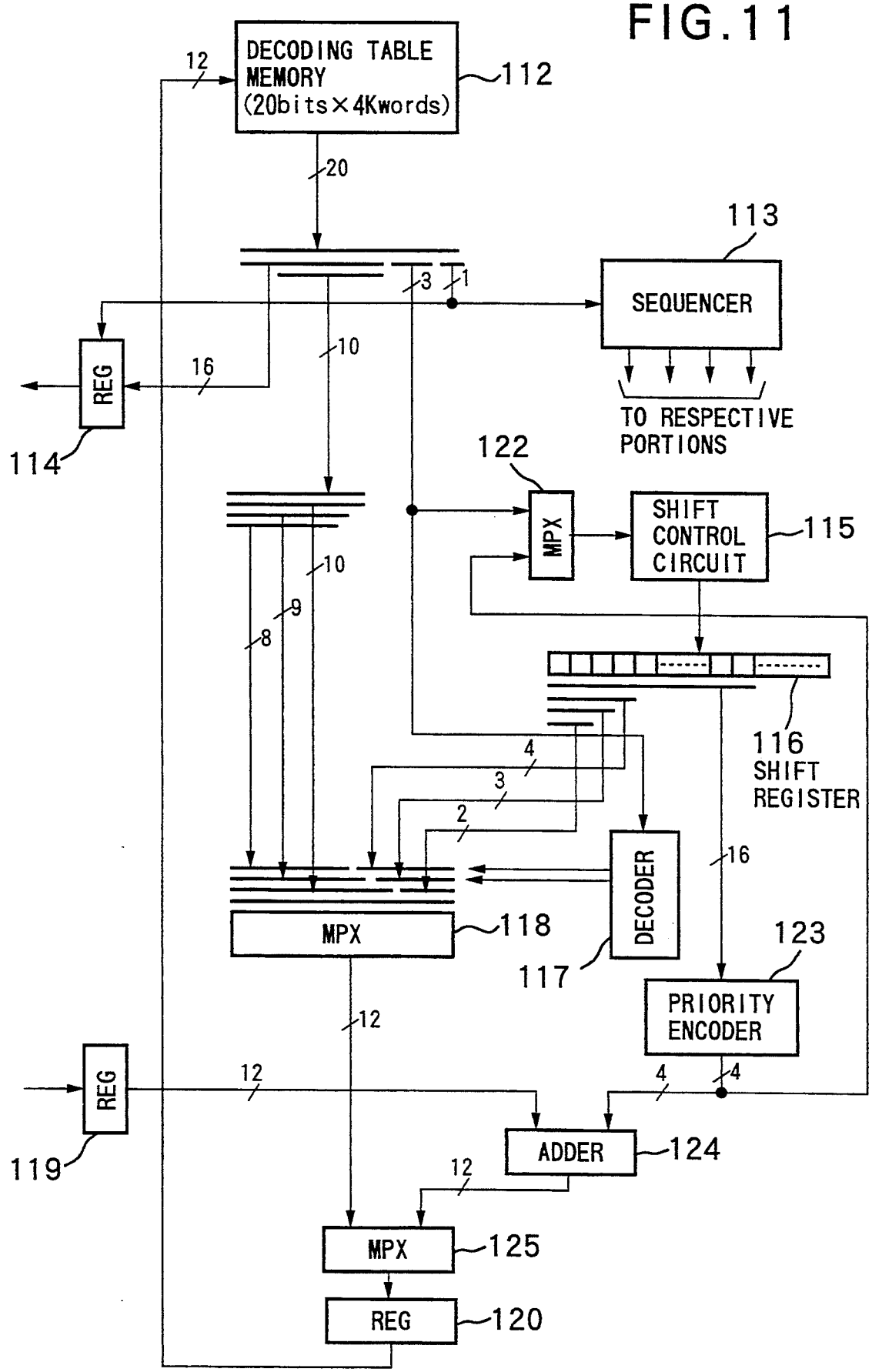
FIG. 11 is a block diagram of the fourth embodiment of a variable length code decoding circuit according to the invention.

FIG. 11 is a block diagram of the fourth embodiment of a variable length code decoding circuit according to the present invention. As shown in FIG. 11, the shown embodiment provides improvement on the decoding speed and size of the decoding table for the foregoing third embodiment. The shown embodiment of the decoding circuit includes the decoding table memory 112, the decoding control sequencer 113, the decoding resultant data register 114, the decoding initial address register 119, the shift control circuit 115, the shift register 116, the shifting magnitude selecting circuit 112, the shifting magnitude decoder 117, the multiplexer 118, a priority encoder (leftmost one detecting encoder) 123, an adder 124, a 2 to 1 multiplexer 125 and the decoding table memory address register 120.

The shown embodiment uses a decoding table of FIG. 12 for decoding the variable length code given by FIG. 19. FIG. 12 shows the decoding table of the variable length code based on the decoding system in FIG. 11. As shown in FIG. 12, the shown decoding table has four data fields, contents of which are identical to those discussed with respect to FIGS. 9 and 10.

Next, operation of the shown embodiment will be discussed with reference to FIG. 11. At first, substantial difference of the shown embodiment to the third embodiment is to significantly earn the decoding bit number utilizing the nature of the code per se upon initiation of decoding. Typical assignment of the variable length (non-equal length) code has a regularity to start with series of 0 (or 1) as shown in FIG. 19, and a long code is rarely assigned to a random combination of 1 and 0. Therefore, in the case such as that in FIG. 19, by classifying the overall codes with series of 0 at the leading end of the codes, codes can be grouped with approximately equal number of codes in each group. This means that if decoding is performed on the basis of the run length of "0" in the first decoding cycle, number of cycles for completion of decoding can be averaged.

On the other hand, in order to realize the foregoing feature in the hardware, the fourth embodiment of the decoding circuit in FIG. 11 includes the priority encoder (leftmost one detecting encoder) 123 in addition to the circuit of FIG. 8. In the shown example, the priority encoder 123 unitedly searches leading sixteen bits of the shift register 116 to output the bit position where 1 appears at first. Namely, when "1" is present in the leading bit of the shift register 116, the bit position becomes 0.

Next, the decoding process in the shown embodiment will be discussed. At first, the initial address is set in the initial address register 119. The value of the initial address is added to the output of the priority encoder 123 by the adder 124. The added data passes the multiplexer 125 which selects the output of the adder 124 only at the first cycle and is stored in the register 120. The operations in the subsequent cycles are identical to that of the third embodiment.

Selection of the first sixteen rows in the decoding table of FIG. 12 is determined by the output of the priority encoder. Therefore, the shifting magnitude in the second cycle is expanded to the range of one to sixteen from the range of one to four in the third embodiment. Therefore, even when the variable length code having a length in the extent of 20 bits, decoding can be completed in two or three cycles. In short, in the decoding table of FIG. 12, decoding can be completed in three cycles in the worst case.

Figure 13:
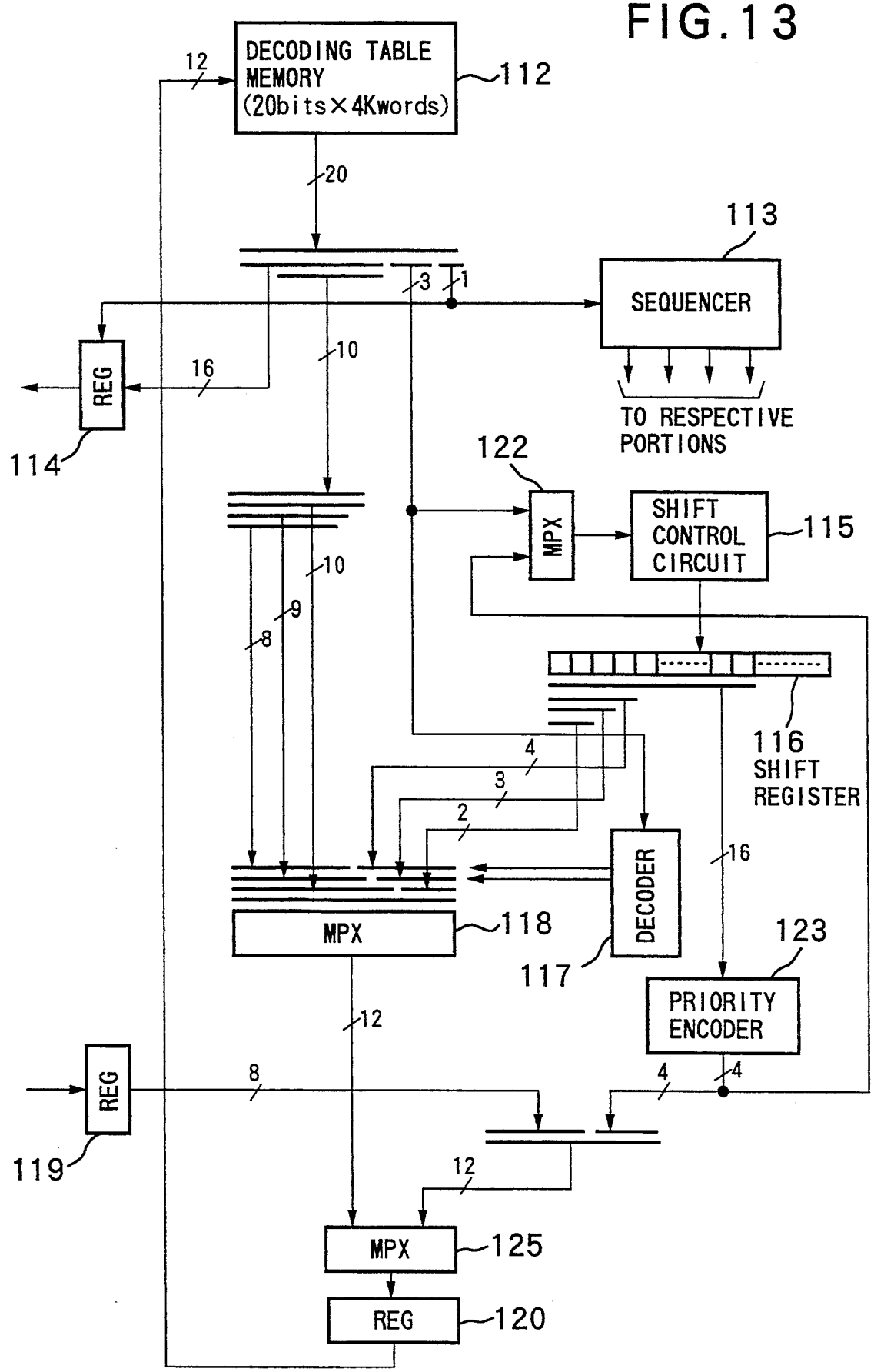
FIG. 13 is a block diagram of the fifth embodiment of a variable length code decoding circuit according to the invention.

FIG. 13 is a block diagram of the fifth embodiment of a decoding circuit according to the invention. As shown in FIG. 13, in comparison with the fourth embodiment illustrated in FIG. 11, the shown embodiment is differentiated in omission of the adder 124. Instead, the shown embodiment establishes 12 bit memory address by coupling the output of the priority encoder 123 as lower bits of 8 bits of the initial address in the initial address register 119. In short, if passing the output of the priority encoder 123 through the adder 124 is critical in timing, the construction of the shown embodiment can be employed. Although this may cause constraint in alignment of the initial address in the decoding table, it may be considered as good trade off with the speed obtained.

As set forth above, the variable length code decoding circuit according to the present invention, can perform decoding process per a plurality of bits with relatively small decoding table. Also, the present invention make the trade off between the memory capacity and the decoding speed into a firmware by variably controlling the number of bits to be decoded so as to provide a flexibility to use a relatively low decoding speed table when the decoding table capacity or the decoding table memory capacity is limited, and a relatively high decoding speed table when the decoding table capacity or the decoding table memory capacity is not limited. Furthermore, in view of sequential decoding of the variable length code, and diverting of the hardware for a plurality of application, the invention can be adapted there to by simply modifying address assignment in the decoding table. This effect may be further enhanced by employing a RAM as the memory. Furthermore, according to the present invention, the side of the decoding table can be remarkably reduced by utilizing the nature of the bit pattern of the variable length code per se.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A variable length code decoding circuit comprising:
   a shift register storing a bit sequence of variable bit length code variable of number of bits;
   decoding table storage means for storing data including an upper field selectively indicative of a meaning of the code and an address for next access, selected depending upon a state transition upon decoding said variable bit length code per n bits, in which n is an integer greater than or equal to two, an intermediate field indicative of a shifting magnitude of said shift register upon completion of decoding, and a lower field indicative of a state of code decoding;
   a shift control means for shifting said bit sequence of said variable bit length code in a magnitude corresponding to a shifting magnitude indicated in said intermediate field when data indicative of the code decoding state in said lower field of the data read out from said decoding table storage means indicates completion of decoding and corresponding to n bits when said data indicative of the code decoding state in said lower field indicates continuation of decoding; and
   means for generating an address for accessing said decoding table storage means by replacing said intermediate field and said lower field of data read out from said decoding table storage means with leading n bits of said shift register.

2. A variable length code decoding circuit as set forth in claim 1, wherein said lower field of said decoding table storage means is data of one bit.

3. A variable length code decoding circuit as set forth in claim 1, which further comprises an initial data register for storing one specific data having the same structure to the data stored in said decoding table storage means and providing said specific data to said address generating means in place of the data read out from said decoding table storage means upon initiation of decoding of said code.

4. A variable length code decoding circuit as set forth in claim 1, which further comprises an end data register for storing the content of said upper field of the read out data as a result of decoding when the data indicative of the code decoding state in the lower field of the data read out from said decoding table storage means indicates completion of decoding.

5. A variable length code decoding circuit comprising:
   a shift register storing a bit sequence of variable bit length code variable of number of bits;
   decoding table storage means for storing data including an upper field selectively indicative of a meaning of the code and an address for next access, selected depending upon a state transition upon decoding said variable bit length code per n bits which n is an integer greater than or equal to two, an intermediate field indicative of a shifting magnitude of said shift register upon completion of decoding, and a lower field indicative of a state of code decoding, said upper and intermediate field containing data indicative of an address for next access, and a plurality of said being divided into blocks of a size of $2^n$ and blocks of lesser size;
   a shift control means for shifting said bit sequence of said variable bit length code in a magnitude corresponding to a shifting magnitude indicated in said intermediate field when data indicative of the code decoding state in said lower field of the data read out from said decoding table storage means indicates completion of decoding and corresponding to n bits when said data indicative of the code decoding state in said lower field indicates continuation of decoding; and
   address designating means for selecting number of bits for designating address in said block depending upon the size of block on the basis of leading n bits of said shift register; and
   means for generating an address for accessing said decoding table storage means by replacing the lower bits of said upper field and said intermediate field of data read out from said decoding table storage means with leading n bits of said shift register.

6. A variable length code decoding circuit as set forth in claim 5, which further comprises an initial data register for storing one specific data having the same structure to the data stored in said decoding table storage means and providing said specific data to said address generating means in place of the data read out from said decoding table storage means upon initiation of decoding of said code.

7. A variable length code decoding circuit as set forth in claim 5, which further comprises an end data register for storing the content of said upper field of the read out data as a result of decoding when the data indicative of the code decoding state in the lower field of the data read out from said decoding table storage means indicates completion of decoding.

8. A variable length code decoding circuit comprising:
   a shift register storing a bit sequence of variable bit length code variable of number of bits;
   decoding table storage means for storing data including an upper field selectively indicative of a meaning of the code and an address for next access, selected depending upon a state transition upon decoding said variable bit length code per n bits which n is an integer greater than or equal to two, an intermediate field indicative of a shifting magnitude of said shift register upon completion of decoding, and a lower field indicative of a state of code decoding;
   shift control means for shifting said bit sequence of said variable bit length code in said shift register for a shifting magnitude indicated in the intermediate field of data read out from said decoding table storage means;
   an initial data register storing an initial data having the same structure to data stored in said decoding table storage means and outputting said initial data every time of completion of decoding for one code;

means for designating leading m bits of said shift register, which m is an integer smaller than or equal to n, depending upon the value in said intermediate field of one of said initial data and the data read out from said decoding table storage means; and means for generating an address for accessing said decoding table storage means by replacing the lower side of said initial data of said initial data register with the leading m bits of said shift register designated by said designating means upon initiation of decoding and by replacing the lower side of the upper field of data read out from said decoding table storage means with leading m bits of said shift register.

9. A variable length code decoding circuit as set forth in claim 8, which further comprises an end data register for storing the content of said upper field of the read out data as a result of decoding when the data indicative of the code decoding state in the lower field of the data read out from said decoding table storage means indicates completion of decoding.

10. A variable length code decoding circuit comprising:

a shift register storing a bit sequence of variable bit length code variable of number of bits;

decoding table storage means for storing data including an upper field selectively indicative of a meaning of the code and an address for next access, selected depending upon a state transition upon decoding said variable bit length code per n bits which n is an integer greater than or equal to two, an intermediate field indicative of a shifting magnitude of said shift register upon completion of decoding, and a lower field indicative of a state of code decoding;

shift control means for shifting said bit sequence of said variable bit length code in said shift register for a shifting magnitude indicated in the intermediate field of data read out from said decoding table storage means;

leftmost one detecting means for searching leading k bits, which k is a positive integer, of said shift register and detecting a bit position where a bit containing "1" appears at first among said k bits;

shift control means for shifting said bit sequence of said variable bit length code in said shift register for one of shifting magnitude indicated in the intermediate field of data read out from said decoding table storage means and shifting magnitude corresponding to the detected value of said leftmost one detecting means;

an initial data register storing an initial data having the same structure to data stored in said decoding table storage means and outputting said initial data every time of completion of decoding for one code;

means for designating leading m bits of said shift register, which m is an integer smaller than or equal to n, depending upon the value in said intermediate field of one of said initial data and the data read out from said decoding table storage means;

adding means for adding said detected value of said leftmost one detecting means to said initial data of said initial data register; and means for generating an address for accessing said decoding table storage means with said added value of said adding means upon initiation of decoding and by replacing the lower side of the upper field of data read out from said decoding table storage means with leading m bits of said shift register.

11. A variable length code decoding circuit as set forth in claim 10, which further comprises an end data register for storing the content of said upper field of the read out data as a result of decoding when the data indicative of the code decoding state in the lower field of the data read out from said decoding table storage means indicates completion of decoding.

12. A variable length code decoding circuit comprising:

a shift register storing a bit sequence of variable bit length code variable of number of bits;

decoding table storage means for storing data including an upper field selectively indicative of a meaning of the code and an address for next access, selected depending upon a state transition upon decoding said variable bit length code per n bits which n is an integer greater than or equal to two, an intermediate field indicative of a shifting magnitude of said shift register upon completion of decoding, and a lower field indicative of a state of code decoding;

an initial data register storing an initial data having the same structure to data stored in said decoding table storage means and outputting said initial data every time of completion of decoding for one code;

leftmost one detecting means for searching leading k bits, which k is a positive integer, of said shift register and detecting a bit position where a bit containing "1" appears at first among said k bits;

shift control means for shifting said bit sequence of said variable bit length code in said shift register for one of shifting magnitude indicated in the intermediate field of data read out from said decoding table storage means and shifting magnitude corresponding to the detected value of said leftmost one detecting means;

means for designating leading m bits of said shift register, which m is an integer smaller than or equal to n, depending upon the value in said intermediate field of one of said initial data and the data read out from said decoding table storage means; and means for generating an address for accessing said decoding table storage means by replacing lower side of said initial data with the detected value of said leftmost one detecting means upon initiation of decoding and by replacing the lower side of the upper field of data read out from said decoding table storage means with leading m bits of said shift register.

13. A variable length code decoding circuit as set forth in claim 12, which further comprises an end data register for storing the content of said upper field of the read out data as a result of decoding when the data indicative of the code decoding state in the lower field of the data read out from said decoding table storage means indicates completion of decoding.

* * * * *